United States Patent
Kim et al.

(10) Patent No.: US 12,327,612 B2
(45) Date of Patent: Jun. 10, 2025

(54) SEMICONDUCTOR SYSTEM FOR PERFORMING A DATA ALIGNMENT OPERATION

(71) Applicant: SK hynix Inc., Icheon-si (KR)

(72) Inventors: Hyun Seung Kim, Icheon-si (KR); Hyeong Soo Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 216 days.

(21) Appl. No.: 18/339,101

(22) Filed: Jun. 21, 2023

(65) Prior Publication Data
US 2024/0282352 A1  Aug. 22, 2024

(30) Foreign Application Priority Data
Feb. 16, 2023  (KR) .......... 10-2023-0021045

(51) Int. Cl.
  *G11C 7/22* (2006.01)
  *G11C 7/10* (2006.01)
(52) U.S. Cl.
  CPC ........... *G11C 7/222* (2013.01); *G11C 7/1093* (2013.01); *G11C 7/1096* (2013.01)
(58) Field of Classification Search
  CPC .................. G11C 7/222; G11C 7/22
  USPC ........................................ 365/233.1
  See application file for complete search history.

(56) References Cited

U.S. PATENT DOCUMENTS

| | | | |
|---|---|---|---|
| 11,803,489 B2* | 10/2023 | Venkatesan | G06F 13/1668 |
| 11,960,739 B1* | 4/2024 | Jeter | G11C 29/021 |
| 2005/0265440 A1* | 12/2005 | Sohn | H03L 7/0807 375/233 |
| 2020/0033407 A1 | 1/2020 | Lin | |
| 2022/0415374 A1* | 12/2022 | Lee | G11C 7/1093 |

FOREIGN PATENT DOCUMENTS

KR  100863000 B1  10/2008

* cited by examiner

*Primary Examiner* — Muna A Techane
(74) *Attorney, Agent, or Firm* — WILLIAM PARK & ASSOCIATES LTD.

(57) ABSTRACT

A semiconductor device includes first and second memory devices configured to share a first transmission line from which a write clock is received and a second transmission line from which data is received. The memory devices receive the data through first to eighth internal clocks that are generated by dividing a frequency of the write clock, and selectively align and store at least some of the data that is received in synchronization with the first to eighth internal clocks based on timing at which the data is synchronized with the write clock.

25 Claims, 25 Drawing Sheets

FIG. 14

| OPERATION | CS1 | CA<1> | CA<2> | CA<3> | CA<4> | CA<5> | CA<6> | CA<7> |
|---|---|---|---|---|---|---|---|---|
| MODE REGISTER WRITE 1 (MRW1) | H | L | L | L | H | H | L | H |
| | L | MA<1> | MA<2> | MA<3> | MA<4> | MA<5> | MA<6> | MA<7> |
| MODE REGISTER WRITE 2 (MRW2) | H | L | L | L | H | L | L | OP<8> |
| | L | OP<1> | OP<2> | OP<3> | OP<4> | OP<5> | OP<6> | OP<7> |

SEMICONDUCTOR SYSTEM FOR PERFORMING A DATA ALIGNMENT OPERATION

CROSS-REFERENCE TO RELATED APPLICATION

The present application claims priority under 35 U.S.C. § 119(a) to Korean application number 10-2023-0021045, filed in the Korean Intellectual Property Office on Feb. 16, 2023, the entire disclosure of which is incorporated herein by reference.

BACKGROUND

The present disclosure generally relates to a semiconductor system, and more particularly, a semiconductor system for performing a data alignment operation of selectively aligning bits that are included in data that is input during the interval of one cycle of a write clock.

Among semiconductor memory devices, a synchronous memory device capable of operating in synchronization with a clock in order to improve its operating speed has emerged. The synchronous memory device that emerged for the first time was a so-called single data rate (SDR) synchronous memory device in which one data is input and output through one data pin during one cycle of a clock in synchronization with a rising edge of the clock. However, since the SDR synchronous memory device is also insufficient to satisfy the speed of a system that requires a high speed operation, a double data rate (DDR) synchronous memory device using a method of processing two data during one cycle of a clock was proposed.

Two data are continuously input and output through each data input and output pin of the DDR synchronous memory device in synchronization with a rising edge and falling edge of a clock that is input from the outside. Although the frequency of the clock is not increased, a high speed operation can be implemented that much because the DDR synchronous memory device can implement at least twice a bandwidth compared to a conventional SDR synchronous memory device. A semiconductor device including the DDR synchronous memory device performs a read operation and a write operation for inputting and outputting data in response to a command that is received from an external chip set. The semiconductor device generates a command and an address for performing a read operation and a write operation, based on a command and an address that are input through a command address pin, and classifies commands and addresses that are continuously input by using a chip selection signal.

SUMMARY

In an embodiment, a semiconductor system may include a first memory device and a second memory device configured to share a first transmission line from which a write clock is received and a second transmission line from which data is received. The first memory device receives the data in synchronization with first to fourth internal clocks that are generated by dividing a frequency of the write clock, and selectively aligns and stores at least some of the data that is received in synchronization with the first to fourth internal clocks based on timing at which the data is synchronized with the write clock. The second memory device receives the data in synchronization with fifth to eighth internal clocks that are generated by dividing the frequency of the write clock, and selectively aligns and stores at least some of the data that is received in synchronization with the fifth to eighth internal clocks based on timing at which the data is synchronized with the write clock.

Furthermore, in an embodiment, a semiconductor system may include a test device configured to output a command address, a clock, and a write clock and configured to output data including multiple bits, and a memory device configured to enter a write operation based on the command address that is input in synchronization with the clock, configured to generate first to fourth latch data by receiving the data in synchronization with first to fourth internal clocks that are generated by dividing a frequency of the write clock in a write operation, configured to generate internal data including multiple bits by aligning at least some of the first to fourth latch data based on timing at which the data is synchronized with the write clock, and configured to store the internal data.

BRIEF DESCRIPTION OF THE DRAWINGS

FIG. 14 is a table for describing an operation of a command address input circuit that is included in the test signal generation circuit illustrated in FIG. 13.

DETAILED DESCRIPTION

Figure 1:
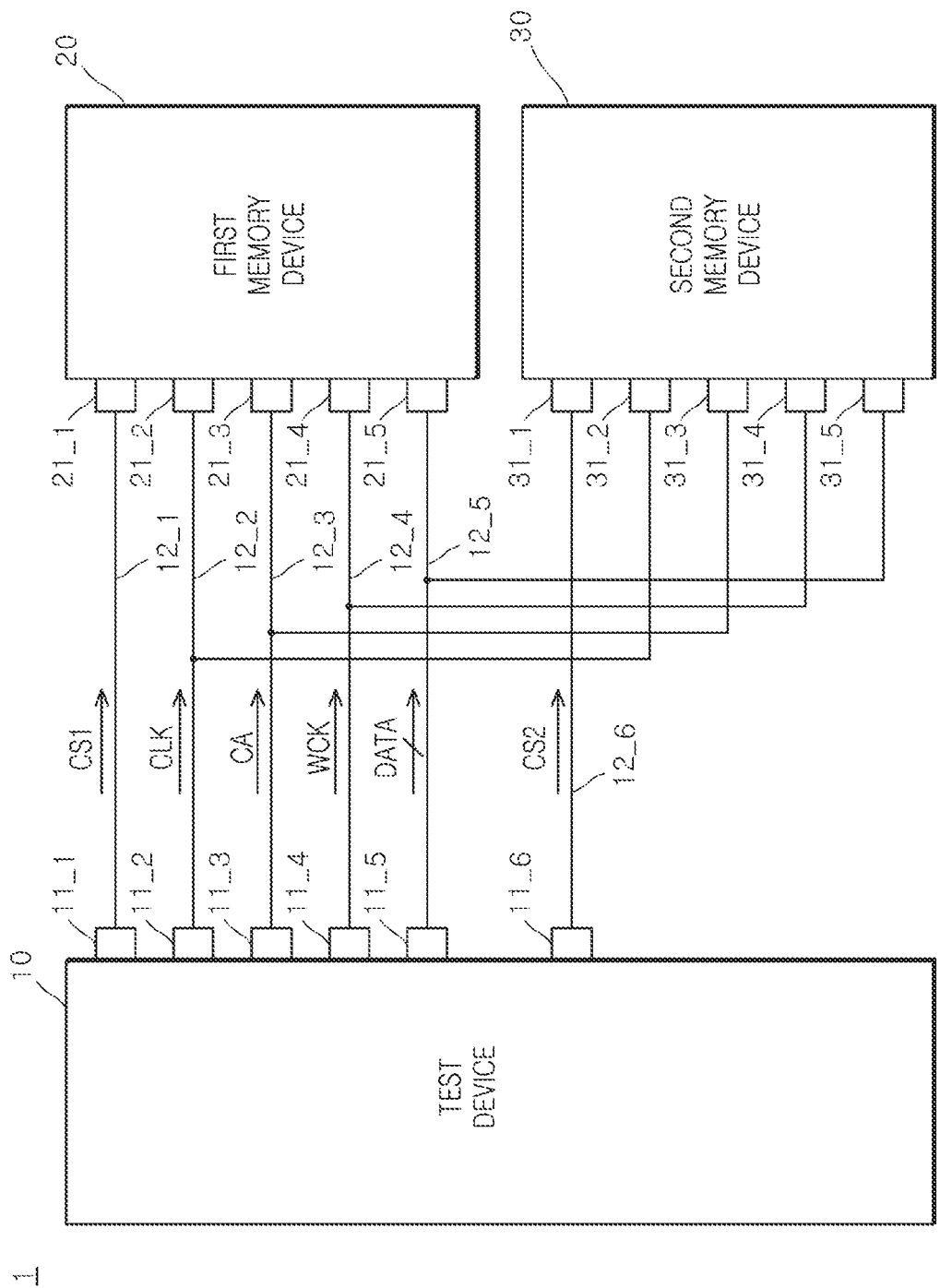
FIG. 1 is a block diagram illustrating a construction of a semiconductor system according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

In an embodiment, the present disclosure provides a semiconductor system that uses DDR synchronous memory devices as an SDR synchronous memory device because a test device transmits, to memory devices, data having the pulse width of one cycle of a write clock.

According to an embodiment of the present disclosure, DDR synchronous memory devices in which data is input and output at a rising edge and falling edge of a write clock can be used as an SDR synchronous memory device because a test device transmits, to memory devices, the data having the pulse width of one cycle of the write clock.

Furthermore, according to an embodiment of the present disclosure, a stable write operation can be performed on memory devices that have different internal delay times depending on a process voltage temperature (PVT) change by using DDR synchronous memory devices as an SDR synchronous memory device.

Furthermore, according to an embodiment of the present disclosure, a data alignment operation of selectively aligning and storing some of bits that are included in data based on timing at which the data is input in synchronization with a write clock can be performed.

As illustrated in FIG. 1, a semiconductor system 1 according to an embodiment of the present disclosure may include a test device 10, a first memory device 20, and a second memory device 30.

The test device 10 may include a first test pin 11_1, a second test pin 11_2, a third test pin 11_3, a fourth test pin 11_4, a fifth test pin 11_5, and a sixth test pin 11_6. The first memory device 20 may include a first device pin 21_1, a second device pin 21_2, a third device pin 21_3, a fourth device pin 21_4, and a fifth device pin 21_5. The second memory device 30 may include a sixth device pin 31_1, a seventh device pin 31_2, an eighth device pin 31_3, a ninth device pin 31_4, and a tenth device pin 31_5. A first transmission line 12_1 may be connected between the first test pin 11_1 and the first device pin 21_1. A second transmission line 12_2 may be connected between the second test pin 11_2, and the second device pin 21_2 and the seventh device pin 31_2. A third transmission line 12_3 may be connected between the third test pin 11_3, and the third device pin 21_3 and the eighth device pin 31_3. A fourth transmission line 12_4 may be connected between the fourth test pin 11_4, and the fourth device pin 21_4 and the ninth device pin 31_4. A fifth transmission line 12_5 may be connected between the fifth test pin 11_5, and the fifth device pin 21_5 and the tenth device pin 31_5. A sixth transmission line 12_6 may be connected between the sixth test pin 11_6 and the sixth device pin 31_1.

The test device 10 may transmit, to the first memory device 20, a first chip selection signal CS1 for selecting the first memory device 20 through the first transmission line 12_1. The test device 10 may transmit, to the first memory device 20 and the second memory device 30, a clock CLK for controlling the first memory device 20 and the second memory device 30 through the second transmission line 12_2. The test device 10 may transmit, to the first memory device 20 and the second memory device 30, a command address CA for controlling the first memory device 20 and the second memory device 30 through the third transmission line 12_3. The test device 10 may transmit, to the first memory device 20 and the second memory device 30, a write clock WCK for latching and aligning data DATA through the fourth transmission line 12_4. The test device 10 may transmit the data DATA to the first memory device 20 and the second memory device 30 through the fifth transmission line 12_5. The test device 10 may transmit, to the second memory device 30, a second chip selection signal CS2 for selecting the second memory device 30 through the sixth transmission line 12_6. The clock CLK and the write clock WCK may be set as signals that have different frequencies and that are periodically toggled. The command address CA may be set as a signal including a command, an address, mode information, and operation information for controlling operations of the first memory device 20 and the second memory device 30. The data DATA may include multiple bits. The multiple bits may be output in series with the pulse width of one cycle of the write clock WCK. The multiple bits that are included in the data DATA may be output so that the multiple bits are synchronized with timing at which any one of a rising edge or falling edge of the write clock WCK is generated. An operation of the multiple bits of the data DATA being synchronized with the timing at which any one of the rising edge or falling edge of the write clock WCK is generated may mean that the center of pulses of the multiple bits that are included in the data DATA are located at the time when the rising edge or falling edge of the write clock WCK is generated.

The first memory device 20 and the second memory device 30 may identically receive the clock CLK by sharing the second transmission line 12_2. The first memory device 20 and the second memory device 30 may identically receive the command address CA by sharing the third transmission line 12_3. The first memory device 20 and the second memory device 30 may identically receive the write clock WCK by sharing the fourth transmission line 12_4. The first memory device 20 and the second memory device 30 may identically receive the data DATA by sharing the fifth transmission line 12_5.

The first memory device 20 may perform a write operation, a mode register write operation, and a test mode, based on the command address CA that is input in synchronization with the clock CLK when the first chip selection signal CS1 is enabled. The first memory device 20 may receive the data DATA through internal clocks that are generated by dividing the frequency of the write clock WCK. The first memory device 20 may align and store the data DATA that has been received. The first memory device 20 may selectively align and store some of the data DATA that is received in synchronization with the internal clocks, based on timing at which the data DATA is synchronized with the write clock WCK.

The second memory device 30 may perform a write operation, a mode register write operation, and the test mode, based on the command address CA that is input in synchronization with the clock CLK when the second chip selection signal CS2 is enabled. The second memory device 30 may receive the data DATA through the internal clocks that are generated by dividing the frequency of the write clock WCK. The second memory device 30 may align and store the data DATA that has been received. The second memory device 30 may selectively align and store some of the data DATA that is received in synchronization with the internal clocks, based on timing at which the data DATA is synchronized with the write clock WCK.

After the start of a normal operation, the first memory device 20 and the second memory device 30 may be implemented as a double data rate (DDR) synchronous memory device that inputs and outputs the data DATA at a rising edge and falling edge of the write clock WCK. Internal delay times of the first memory device 20 and the second memory device 30 may be differently set depending on a process voltage temperature (PVT) change.

Figure 2:
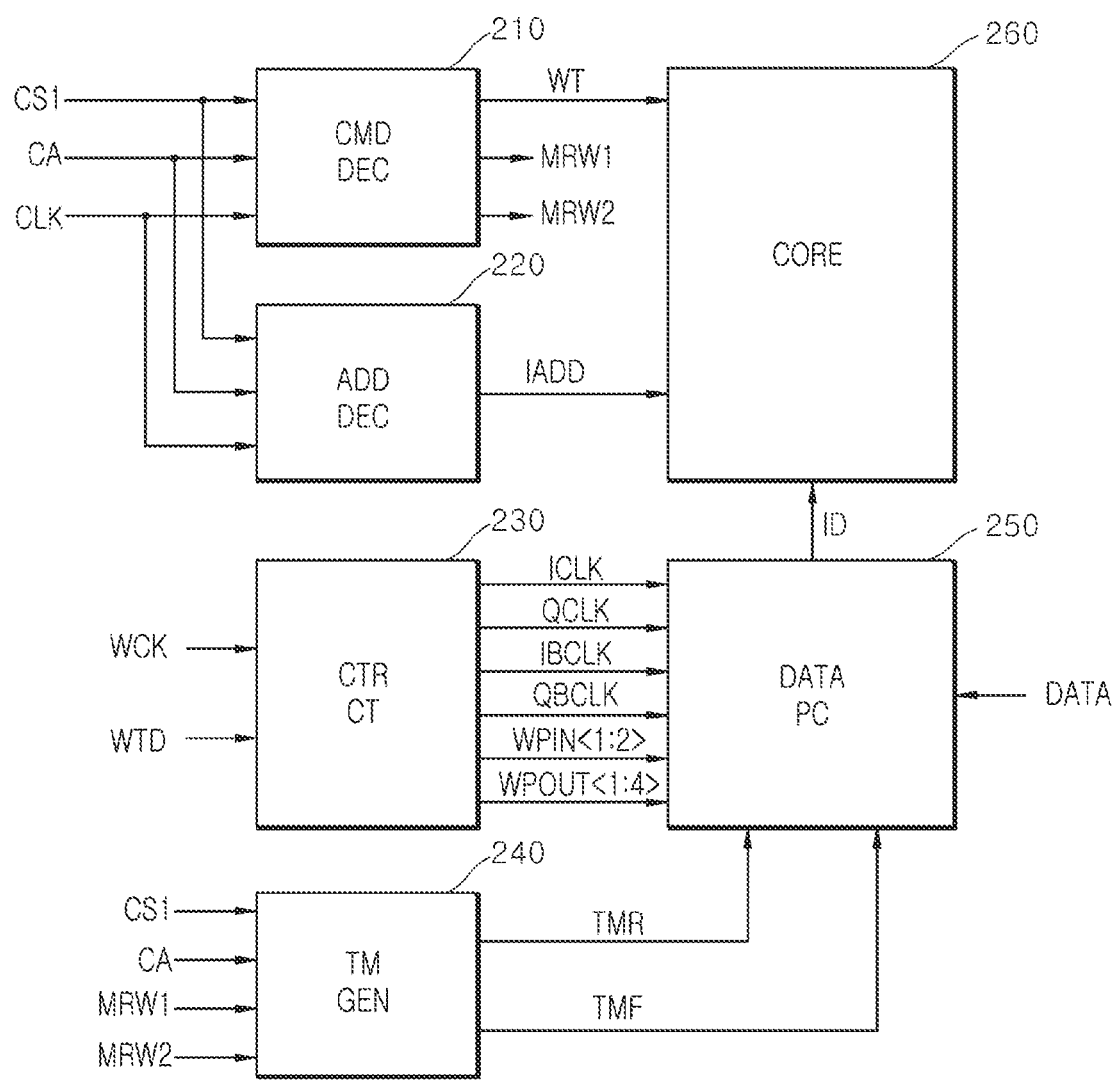
FIG. 2 is a block diagram illustrating a construction of a first memory device that is included in the semiconductor system illustrated in FIG. 1.

As illustrated in FIG. 2, the first memory device 20 may include a command decoder (CMD DEC) 210, an address decoder (ADD DEC) 220, a control circuit (CTR CT) 230, a test signal generation circuit (TM GEN) 240, a data processing circuit (DATA PC) 250, and a core circuit (CORE) 260.

The command decoder 210 may generate a write command WT, a first mode write command MRW1, and a second mode write command MRW2 based on the command address CA in synchronization with the clock CLK when the first chip selection signal CS1 is enabled. The command decoder 210 may generate the write command WT if the command address CA that is input in synchronization with the clock CLK when the first chip selection signal CS1 is enabled has a logic level combination for performing a write operation. The command decoder 210 may generate the first mode write command MRW1 if the command address CA that is input in synchronization with the clock CLK when the first chip selection signal CS1 is enabled has a logic level combination for performing a first mode register write operation. The command decoder 210 may generate the second mode write command MRW2 if the command address CA that is input in synchronization with the clock CLK when the first chip selection signal CS1 is enabled has a logic level combination for performing a second mode register write operation. The logic level combinations of the command addresses CA for performing the write operation, the first mode register write operation, and the second mode register write operation may be differently set. For example, a logic level combination of first to fourth command addresses CA<1:4> for performing the write operation may be set as "H, H, L, L." A logic level combination of first to seventh command addresses CA<1:7> for performing the first mode register write operation may be set as "L, L, L, H, H, L, H." A logic level combination of first to sixth command addresses CA<1:6> for performing the second mode register write operation may be set as "L, L, L, H, L, L." The numbers of bits and the logic level combinations for performing the write operation, the first mode register write operation, and the second mode register write operation may be variously set depending on embodiments.

The address decoder 220 may generate an internal address IADD based on the command address CA in synchronization with the clock CLK when the first chip selection signal CS1 is disabled. The address decoder 220 may generate the internal address IADD by decoding the command address CA that is input in synchronization with the clock CLK when the first chip selection signal CS1 is disabled. The internal address IADD may be set as a signal including multiple bits for selecting multiple memory cells (not illustrated) that are included in the core circuit 260.

The control circuit 230 may generate a first internal clock ICLK, a second internal clock QCLK, a third internal clock IBCLK, and a fourth internal clock QBCLK by dividing the frequency of the write clock WCK. The control circuit 230 may generate the first internal clock ICLK, the second internal clock QCLK, the third internal clock IBCLK, and the fourth internal clock QBCLK having different phases by dividing the frequency of the write clock WCK. The control circuit 230 may generate the first internal clock ICLK, the second internal clock QCLK, the third internal clock IBCLK, and the fourth internal clock QBCLK each having a frequency that is half the frequency of the write clock WCK. The control circuit 230 may generate a first write input control signal WPIN<1> and a second write input control signal WPIN<2> based on the second internal clock QCLK and the fourth internal clock QBCLK. The control circuit 230 may generate a first write output control signal WPOUT<1>, a second write output control signal WPOUT<2>, a third write output control signal WPOUT<3>, and a fourth write output control signal WPOUT<4>, based on a write delay signal WTD that is generated by delaying the write command WT, the second internal clock QCLK, and the fourth internal clock QBCLK.

The test signal generation circuit 240 may generate a rising test signal TMR and a falling test signal TMF, based on mode information (MA<1:7> in FIG. 14) that is input from the command address CA when the first chip selection signal CS1 is enabled and the first mode write command MRW1 is enabled and operation information (OP<1:8> in FIG. 14) that is input from the command address CA when the second mode write command MRW2 is enabled. The rising test signal TMR may be enabled when multiple bits that are included in the data DATA are input so that the multiple bits are synchronized with timing at which a rising edge of the write clock WCK is generated. The falling test signal TMF may be enabled when multiple bits that are included in the data DATA are input so that the multiple bits are synchronized with timing at which a falling edge of the write clock WCK is generated.

The data processing circuit 250 may receive the data DATA including multiple bits, in synchronization with the first internal clock ICLK, the second internal clock QCLK, the third internal clock IBCLK, and the fourth internal clock QBCLK. The data processing circuit 250 may generate internal data ID by aligning the data DATA including multiple bits, based on the rising test signal TMR, the falling test signal TMF, the first write input control signal WPIN<1>, the second write input control signal WPIN<2>, the first write output control signal WPOUT<1>, the second write output control signal WPOUT<2>, the third write output control signal WPOUT<3>, and the fourth write output control signal WPOUT<4>. The data processing circuit 250 may generate the internal data ID by aligning bits that are included in the data DATA that is input in synchronization with the first internal clock ICLK and the third internal clock IBCLK when the rising test signal TMR is enabled, based on the first write input control signal WPIN<1>, the second write input control signal WPIN<2>, the first write output control signal WPOUT<1>, the second write output control signal WPOUT<2>, the third write output control signal WPOUT<3>, and the fourth write output control signal WPOUT<4>. The data processing circuit 250 may generate the internal data ID by aligning bits that are included in the data DATA that is input in synchronization with the second internal clock QCLK and the fourth internal clock QBCLK when the falling test signal TMF is enabled, based on the first write input control signal WPIN<1>, the second write input control signal WPIN<2>, the first write output control signal WPOUT<1>, the second write output control signal WPOUT<2>, the third write output control signal WPOUT<3>, and the fourth write output control signal WPOUT<4>. The internal data ID may include multiple bits, and may be generated in parallel.

The core circuit 260 may be implemented as a common core circuit including multiple memory cells (not illustrated). The core circuit 260 may store the internal data ID after the start of a write operation. The core circuit 260 may store the internal data ID in a memory cell (not illustrated) that is selected by the internal address IADD when the write command WT is enabled. Although the core circuit 260 has been illustrated as performing a write operation, the core circuit 260 may be implemented to perform a read operation, a precharge operation, or a refresh operation.

The first memory device 20 may enter a write operation based on the command address CA that is input in synchronization with the clock CLK. The first memory device 20 may receive the data DATA that include multiple bits and that are input in series, through the first internal clock ICLK, the second internal clock QCLK, the third internal clock IBCLK, and the fourth internal clock QBCLK that are generated by dividing the frequency of the write clock WCK in the write operation. The first memory device 20 may generate the internal data ID including multiple bits by aligning the data DATA including multiple bits. The first memory device 20 may store the internal data ID including multiple bits. The first memory device 20 may selectively align and store some of the data DATA that has been received in synchronization with the first internal clock ICLK, the second internal clock QCLK, the third internal clock IBCLK, and the fourth internal clock QBCLK based on timing at which the data DATA is synchronized with the write clock WCK.

The second memory device 30 merely receives the second chip selection signal CS2 instead of the first memory device 20 and may be implemented as the same circuit as the first memory device 20 and may perform the same operation as the first memory device 20 but for receiving the second chip selection signal CS2. Accordingly, a detailed description of the second memory device 30 will be omitted.

Figure 3:
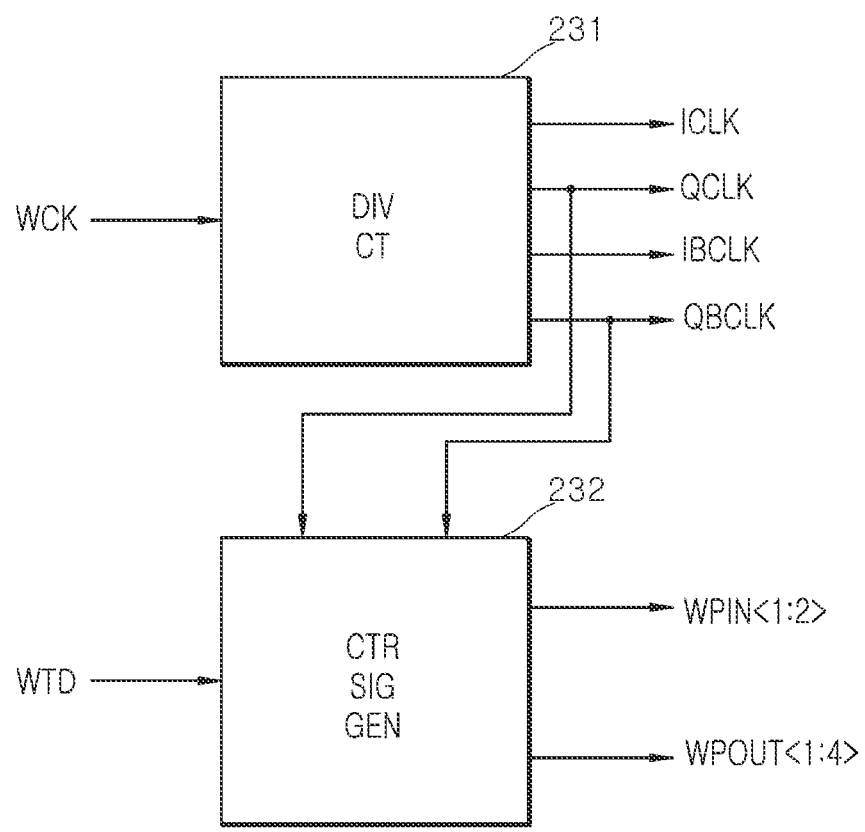
FIG. 3 is a block diagram illustrating a construction of a control circuit that is included in the first memory device illustrated in FIG. 2.

FIG. 3 is a block diagram illustrating a construction according to an embodiment of the control circuit 230 that is included in the first memory device 20. The control circuit 230 may include a frequency division circuit (DIV CT) 231 and a control signal generation circuit (CTR SIG GEN) 232.

The frequency division circuit 231 may generate the first internal clock ICLK, the second internal clock QCLK, the third internal clock IBCLK, and the fourth internal clock QBCLK by dividing the frequency of the write clock WCK. The frequency division circuit 231 may generate the first internal clock ICLK, the second internal clock QCLK, the third internal clock IBCLK, and the fourth internal clock QBCLK having different phases by dividing the frequency of the write clock WCK. The frequency division circuit 231 may generate the first internal clock ICLK, the second internal clock QCLK, the third internal clock IBCLK, and the fourth internal clock QBCLK each having a frequency that is half the frequency of the write clock WCK. Frequencies and phases of the first internal clock ICLK, the second internal clock QCLK, the third internal clock IBCLK, and the fourth internal clock QBCLK that are generated by the frequency division circuit 231 will be described in detail later with reference to FIG. 5.

The control signal generation circuit 232 may generate the first write input control signal WPIN<1> and the second write input control signal WPIN<2>, based on the second internal clock QCLK and the fourth internal clock QBCLK. The control signal generation circuit 232 may generate the first write input control signal WPIN<1> and the second write input control signal WPIN<2> by buffering the second internal clock QCLK and the fourth internal clock QBCLK. The control signal generation circuit 232 may generate the first write output control signal WPOUT<1>, the second write output control signal WPOUT<2>, the third write output control signal WPOUT<3>, and the fourth write output control signal WPOUT<4>, based on the write delay signal WTD that is generated by delaying the write command WT, the second internal clock QCLK, and the fourth internal clock QBCLK. The control signal generation circuit 232 may generate the first write output control signal WPOUT<1>, the second write output control signal WPOUT<2>, the third write output control signal WPOUT<3>, and the fourth write output control signal WPOUT<4> that are sequentially enabled based on the logic levels of the second internal clock QCLK and the fourth internal clock QBCLK when the write delay signal WTD is enabled.

Figure 4:
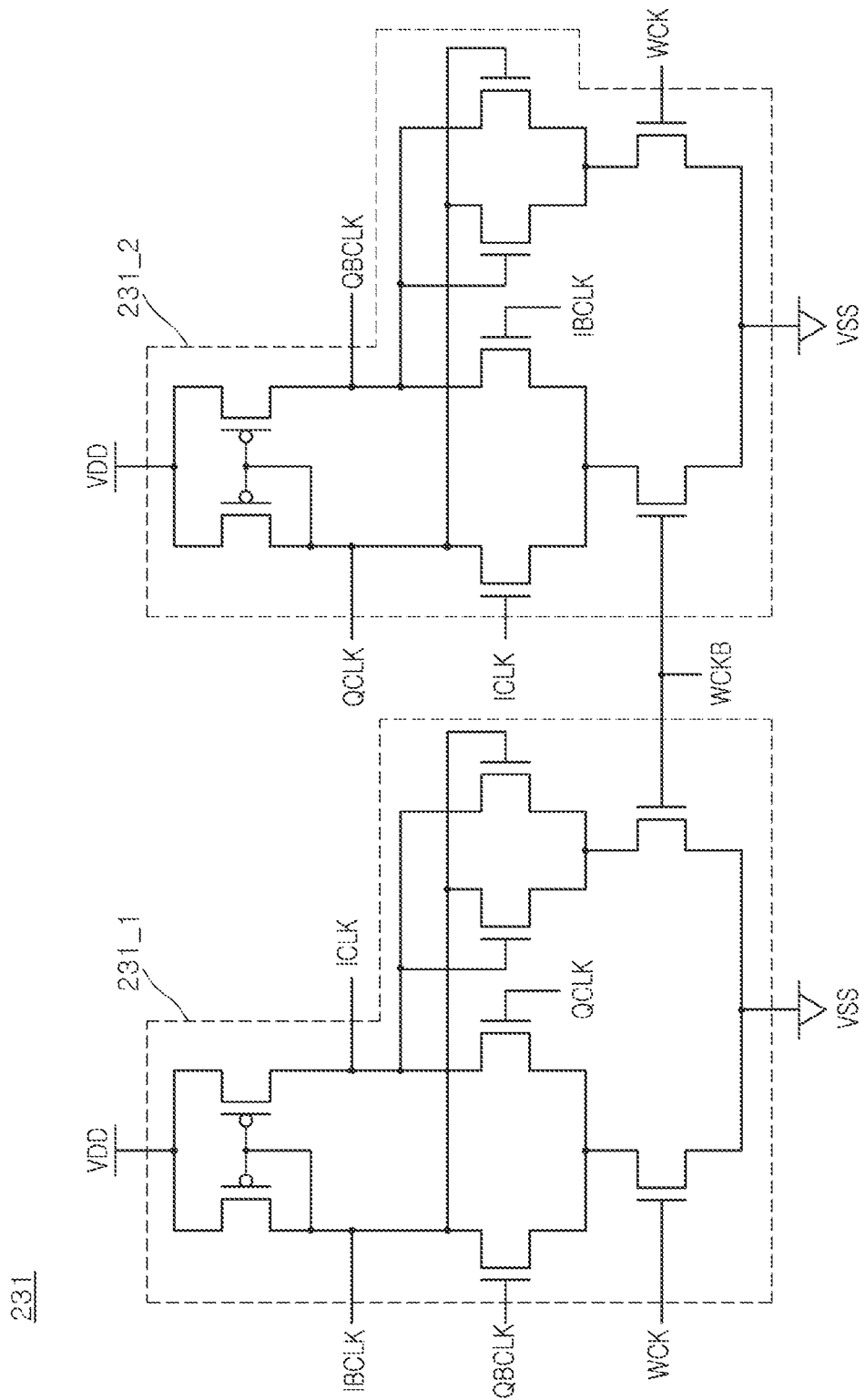
FIG. 4 is a circuit diagram illustrating a construction of a frequency division circuit that is included in the control circuit illustrated in FIG. 3.

FIG. 4 is a circuit diagram illustrating a construction according to an embodiment of the frequency division circuit 231 that is included in the control circuit 230. The frequency division circuit 231 may include a first comparison circuit 231_1 and a second comparison circuit 231_2.

When the write clock WCK having a logic high level is generated and an inverted write clock WCKB having a logic low level is generated, the first comparison circuit 231_1 may generate the first internal clock ICLK having a logic high level by driving the first internal clock ICLK with a power supply voltage VDD. When the logic level of the second internal clock QCLK is a logic high level and the write clock WCK having a logic high level is generated again, the first comparison circuit 231_1 may generate the first internal clock ICLK having a logic low level by driving the first internal clock ICLK with a ground voltage VSS. When the write clock WCK having a logic high level is generated and the inverted write clock WCKB having a logic low level is generated, the first comparison circuit 231_1 may generate the third internal clock IBCLK having a logic high level by driving the third internal clock IBCLK with the power supply voltage VDD. When the logic level of the fourth internal clock QBCLK is a logic high level and the write clock WCK having a logic high level is generated again, the first comparison circuit 231_1 may generate the third internal clock IBCLK having a logic low level by driving the third internal clock IBCLK with the ground voltage VSS. The inverted write clock WCKB may be set as an inverted signal of the write clock WCK.

When the inverted write clock WCKB having a logic high level is generated and the write clock WCK having a logic low level is generated, the second comparison circuit 231_2 may generate the second internal clock QCLK having a logic high level by driving the second internal clock QCLK with the power supply voltage VDD. When the logic level of the first internal clock ICLK is a logic high level and the inverted write clock WCKB having a logic high level is generated again, the second comparison circuit 231_2 may generate the second internal clock QCLK having a logic low level by driving the second internal clock QCLK with the ground voltage VSS. When the inverted write clock WCKB having a logic high level is generated and the write clock WCK having a logic low level is generated, the second comparison circuit 231_2 may generate the fourth internal clock QBCLK having a logic high level by driving the fourth internal clock QBCLK with the power supply voltage VDD. When the logic level of the third internal clock IBCLK is a logic high level and the inverted write clock WCKB having a logic high level is generated again, the second comparison circuit 231_2 may generate the fourth internal clock QBCLK having a logic low level by driving the fourth internal clock QBCLK with the ground voltage VSS.

Figure 5:
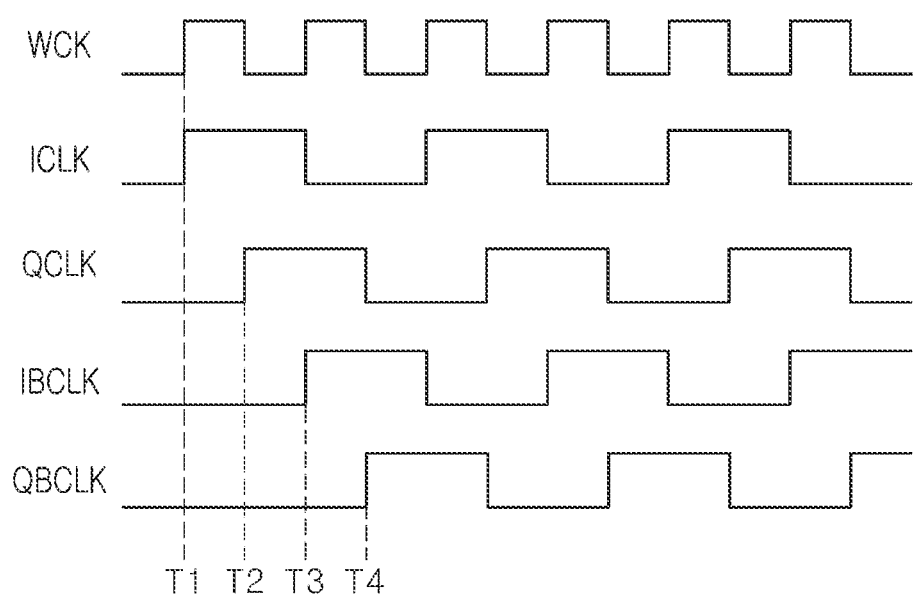
FIG. 5 is a timing diagram for describing an operation of a frequency division circuit that is included in the control circuit illustrated in FIG. 3.

An operation of the frequency division circuit 231 according to an embodiment of the present disclosure is described with reference to FIG. 5. In this case, the frequencies and phases of the first internal clock ICLK, the second internal clock QCLK, the third internal clock IBCLK, and the fourth internal clock QBCLK that are generated by the frequency division circuit 231 are described as follows.

First, the frequencies of the first internal clock ICLK, the second internal clock QCLK, the third internal clock IBCLK, and the fourth internal clock QBCLK are described as follows.

At timing T1, the frequency division circuit 231 may generate the first internal clock ICLK having a logic high level when the write clock WCK having a logic high level is generated. The frequency division circuit 231 may generate the first internal clock ICLK having a logic low level when the write clock WCK having a logic high level is generated again. Accordingly, the first internal clock ICLK may be generated to have a frequency that is half the frequency of the write clock WCK.

At timing T2, when the write clock WCK having a logic low level is generated, the frequency division circuit 231 may generate the second internal clock QCLK having a logic high level. When the write clock WCK having a logic low level is generated again, the frequency division circuit 231 may generate the second internal clock QCLK having a logic low level. Accordingly, the second internal clock QCLK may be generated to have a frequency that is half the frequency of the write clock WCK.

At timing T3, when the write clock WCK having a logic high level is generated, the frequency division circuit 231 may generate the third internal clock IBCLK having a logic high level. When the write clock WCK having a logic high level is generated again, the frequency division circuit 231 may generate the third internal clock IBCLK having a logic low level. Accordingly, the third internal clock IBCLK may be generated to have a frequency that is half the frequency of the write clock WCK.

At timing T4, when the write clock WCK having a logic low level is generated, the frequency division circuit 231 may generate the fourth internal clock QBCLK having a logic high level. When the write clock WCK having a logic low level is generated again, the frequency division circuit 231 may generate the fourth internal clock QBCLK having a logic low level. Accordingly, the fourth internal clock QBCLK may be generated to have a frequency that is half the frequency of the write clock WCK.

The phases of the first internal clock ICLK, the second internal clock QCLK, the third internal clock IBCLK, and the fourth internal clock QBCLK are described as follows. The second internal clock QCLK may be generated at timing T2 that is after a ½ cycle of the write clock WCK from timing T1 at which the first internal clock ICLK is generated. The third internal clock IBCLK may be generated at timing T3 that is after a ½ cycle of the write clock WCK from timing T2 at which the second internal clock QCLK is generated. The fourth internal clock QBCLK may be generated at timing T4 that is after a ½ cycle of the write clock WCK from timing T3 at which the third internal clock IBCLK is generated. Accordingly, the phases of the first internal clock ICLK, the second internal clock QCLK, the third internal clock IBCLK, and the fourth internal clock QBCLK may be generated differently.

Figure 6:
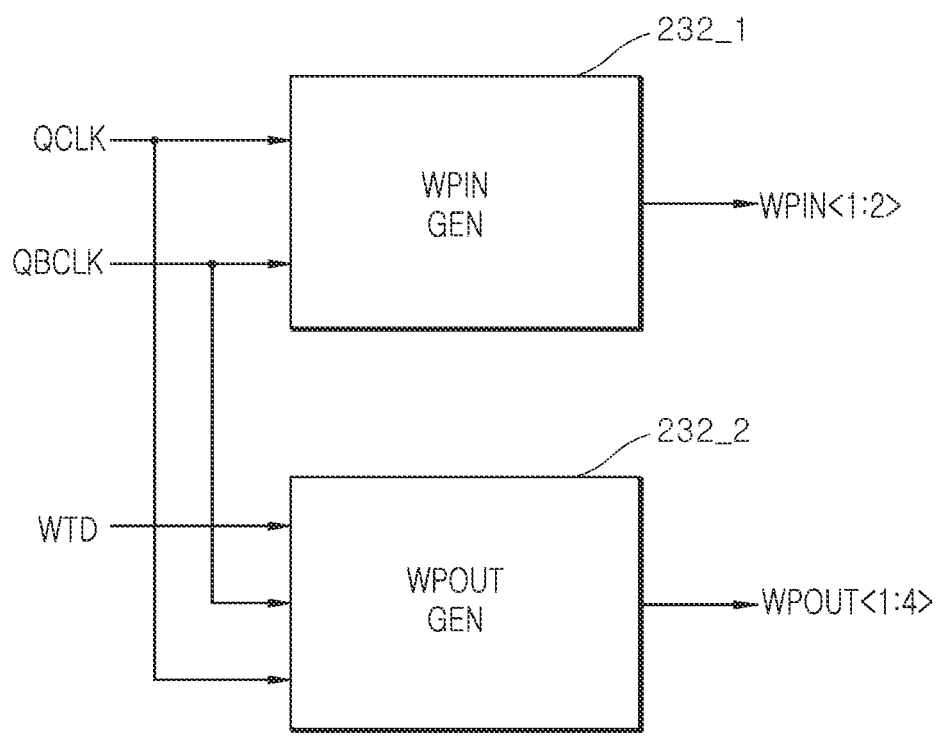
FIG. 6 is a block diagram illustrating a construction of a control signal generation circuit that is included in the control circuit illustrated in FIG. 3.

FIG. 6 is a block diagram illustrating a construction according to an embodiment of the control signal generation circuit 232 that is included in the control circuit 230. The control signal generation circuit 232 may include an input control signal generation circuit (WPIN GEN) 232_1 and an output control signal generation circuit (WPOUT GEN) 232_2.

The input control signal generation circuit 232_1 may generate the first write input control signal WPIN<1> and the second write input control signal WPIN<2>, based on the second internal clock QCLK and the fourth internal clock QBCLK. The input control signal generation circuit 232_1 may generate the first write input control signal WPIN<1> by buffering the second internal clock QCLK. The input control signal generation circuit 232_1 may generate the second write input control signal WPIN<2> by buffering the fourth internal clock QBCLK.

The output control signal generation circuit 232_2 may generate the first write output control signal WPOUT<1>, the second write output control signal WPOUT<2>, the third write output control signal WPOUT<3>, and the fourth write output control signal WPOUT<4>, based on the write delay signal WTD that is generated by delaying the write command WT, the second internal clock QCLK, and the fourth internal clock QBCLK. The output control signal generation circuit 232_2 may generate the first write output control signal WPOUT<1>, the second write output control signal WPOUT<2>, the third write output control signal WPOUT<3>, and the fourth write output control signal WPOUT<4> that are sequentially enabled based on the logic levels of the second internal clock QCLK and the fourth internal clock QBCLK when the write delay signal WTD is enabled.

Figure 7:
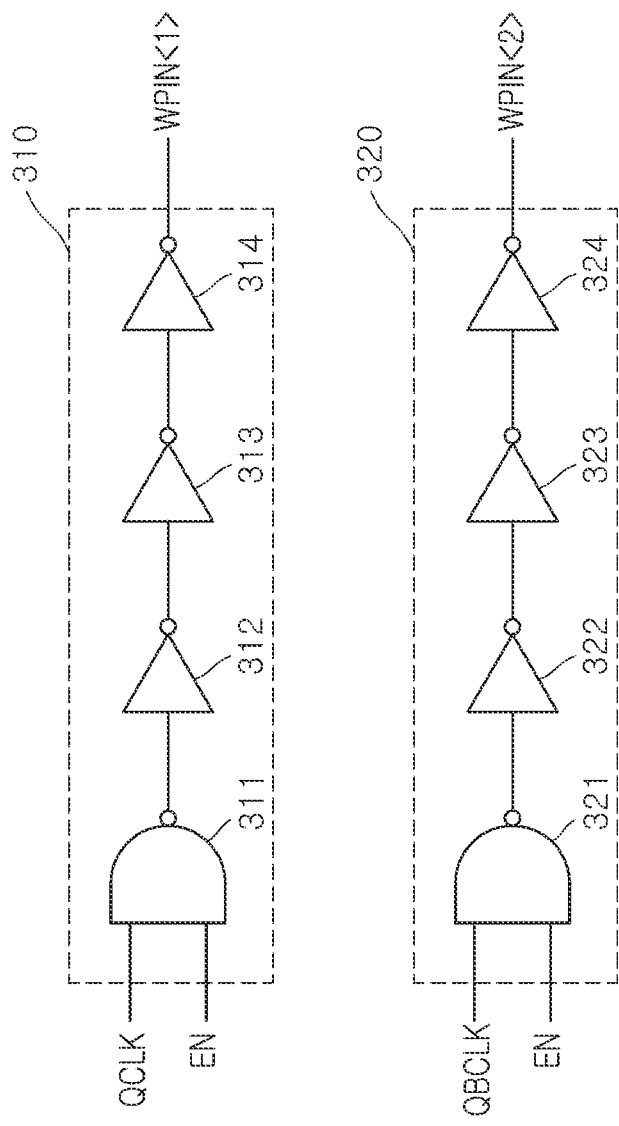
FIG. 7 is a circuit diagram illustrating a construction of an input control signal generation circuit that is included in the control signal generation circuit illustrated in FIG. 6.

FIG. 7 is a circuit diagram illustrating a construction according to an embodiment of the input control signal generation circuit 232_1 that is included in the control signal generation circuit 232. The input control signal generation circuit 232_1 may include a first clock transfer circuit 310 and a second clock transfer circuit 320.

The first clock transfer circuit 310 may be implemented by connecting a NAND gate 311 and inverters 312, 313, and 314 in series. The first clock transfer circuit 310 may generate the first write input control signal WPIN<1> by buffering the second internal clock QCLK when an enable signal EN is enabled to a logic high level. The enable signal EN may be set as a signal that is enabled to a logic high level during an interval in which the write clock WCK is input.

The second clock transfer circuit 320 may be implemented by connecting a NAND gate 321 and inverters 322, 323, and 324 in series. The second clock transfer circuit 320 may generate the second write input control signal WPIN<2> by buffering the fourth internal clock QBCLK when the enable signal EN is enabled to a logic high level.

Figure 8:
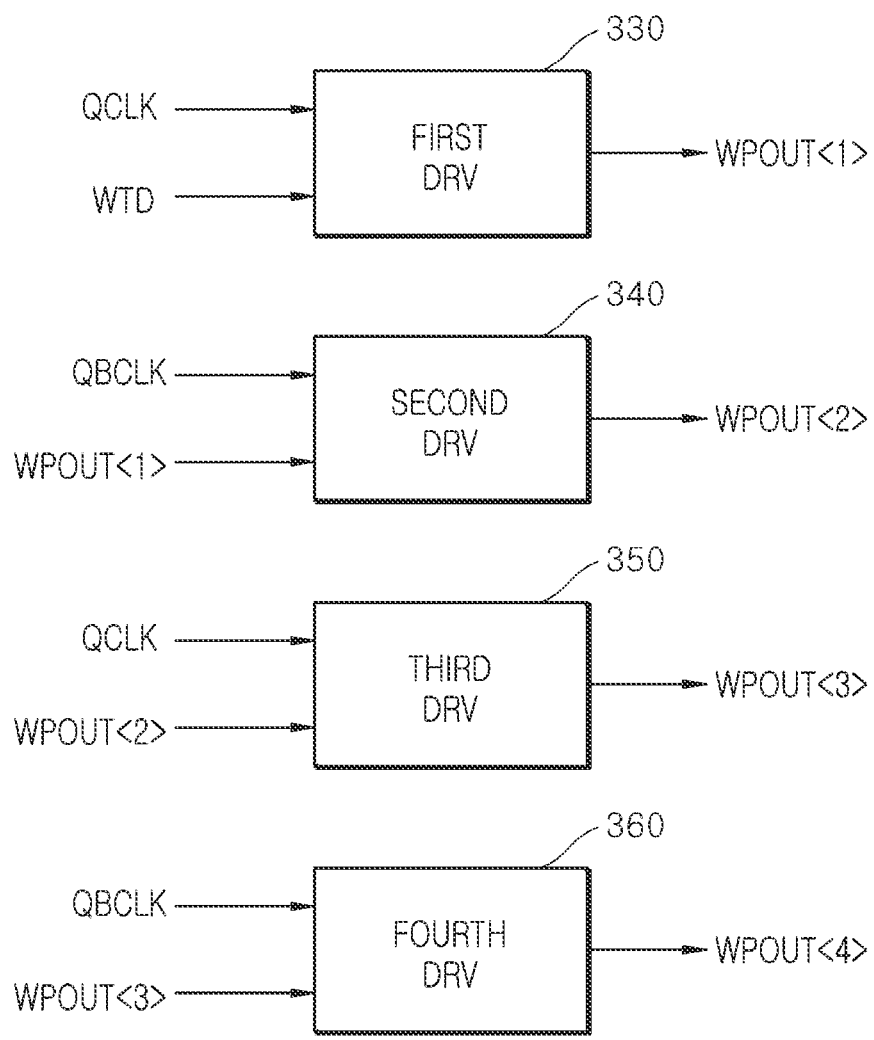
FIG. 8 is a block diagram illustrating a construction of an output control signal generation circuit that is included in the control signal generation circuit illustrated in FIG. 6.

FIG. 8 is a block diagram illustrating a construction according to an embodiment of the output control signal generation circuit 232_2 that is included in the control signal generation circuit 232. The output control signal generation circuit 232_2 may include a first clock driving circuit (FIRST DRV) 330, a second clock driving circuit (SECOND DRV) 340, a third clock driving circuit (THIRD DRV) 350, and a fourth clock driving circuit (FOURTH DRV) 360.

The first clock driving circuit 330 may generate the first write output control signal WPOUT<1>, based on the write delay signal WTD that is generated by delaying the write command WT and the second internal clock QCLK. The first clock driving circuit 330 may generate the first write output control signal WPOUT<1> that is enabled to a logic high level after the second internal clock QCLK having a logic high level is input. The first clock driving circuit 330 may generate the first write output control signal WPOUT<1> that is disabled to a logic low level when the write delay signal WTD having a logic high level is input and the second internal clock QCLK having a logic low level is generated.

The second clock driving circuit 340 may generate the second write output control signal WPOUT<2>, based on the first write output control signal WPOUT<1> and the fourth internal clock QBCLK. The second clock driving circuit 340 may generate the second write output control signal WPOUT<2> that is enabled to a logic high level after the fourth internal clock QBCLK having a logic high level is input. The second clock driving circuit 340 may generate the second write output control signal WPOUT<2> that is disabled to a logic low level when the first write output control signal WPOUT<1> having a logic high level is input and the fourth internal clock QBCLK having a logic low level is generated.

The third clock driving circuit 350 may generate the third write output control signal WPOUT<3>, based on the second write output control signal WPOUT<2> and the second internal clock QCLK. The third clock driving circuit 350 may generate the third write output control signal WPOUT<3> that is enabled to a logic high level after the second internal clock QCLK having a logic high level is input. The third clock driving circuit 350 may generate the third write output control signal WPOUT<3> that is disabled to a logic low level when the second internal clock QCLK having a logic low level is generated after the second write output control signal WPOUT<2> having a logic high level is input.

The fourth clock driving circuit 360 may generate the fourth write output control signal WPOUT<4>, based on the third write output control signal WPOUT<3> and the fourth internal clock QBCLK. The fourth clock driving circuit 360 may generate the fourth write output control signal WPOUT<4> that is enabled to a logic high level after the fourth internal clock QBCLK having a logic high level is input. The fourth clock driving circuit 360 may generate the fourth write output control signal WPOUT<4> that is disabled to a logic low level when the third write output control signal WPOUT<3> having a logic high level is input and the fourth internal clock QBCLK having a logic low level is generated.

Figure 9:
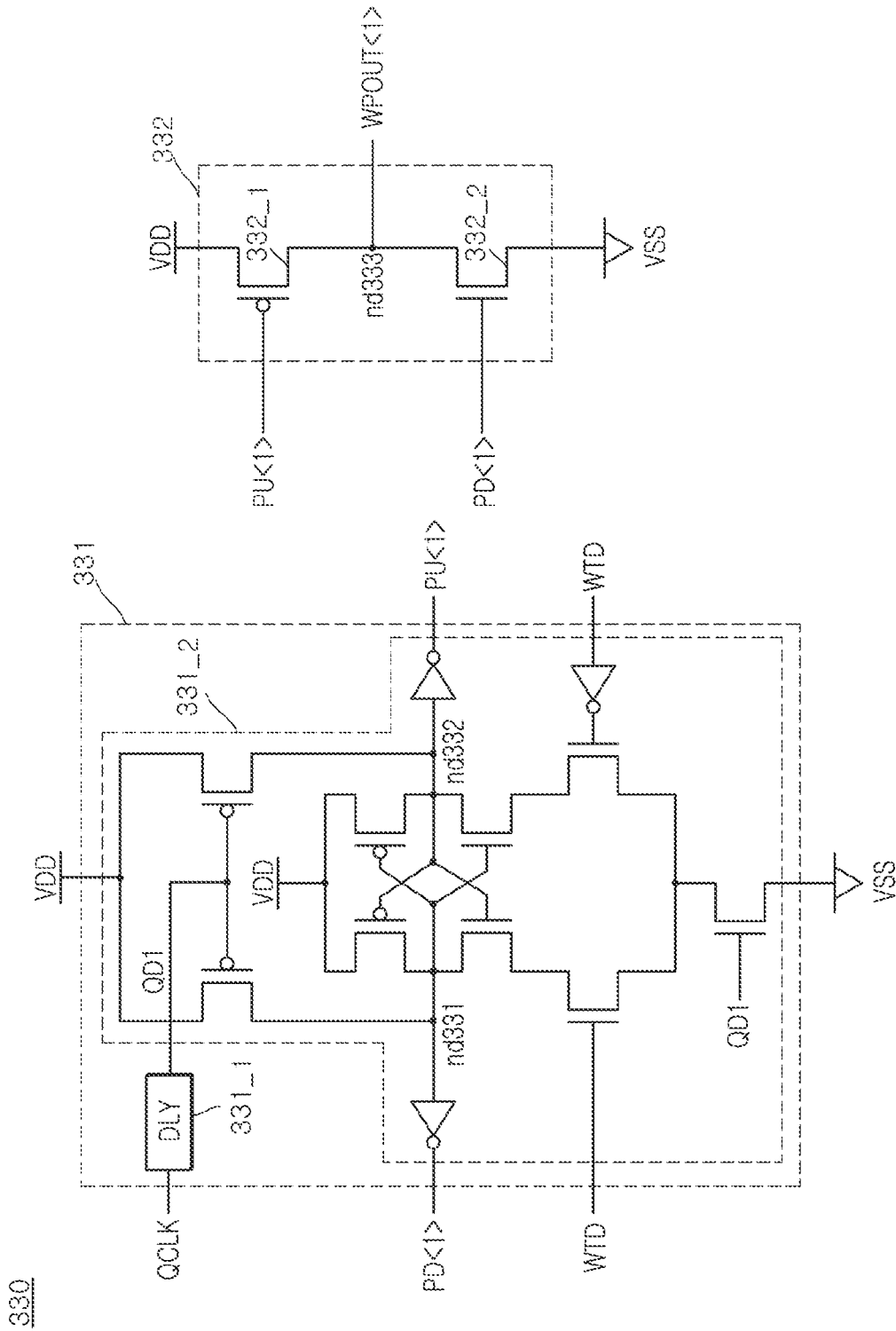
FIG. 9 is a diagram illustrating a construction of a first clock driving circuit that is included in the output control signal generation circuit illustrated in FIG. 8.

FIG. 9 is a diagram illustrating a construction according to an embodiment of the first clock driving circuit 330 that is included in the output control signal generation circuit 232_2. The first clock driving circuit 330 may include a first driving signal generation circuit 331 and a first driving circuit 332.

The first driving signal generation circuit 331 may include a first delay circuit (DLY) 331_1 and a first pull-up/pull-down driving signal generation circuit 331_2.

The first delay circuit 331_1 may generate a first delay clock QD1 by inverting and delaying the second internal clock QCLK.

The first pull-up/pull-down driving signal generation circuit 331_2 may drive a node nd331 and a node nd332 with the power supply voltage VDD when the logic level of the first delay clock QD1 is a logic low level. The first pull-up/pull-down driving signal generation circuit 331_2 may generate the first pull-down driving signal PD<1> having a logic low level when the node nd331 is driven by the power supply voltage VDD. The first pull-up/pull-down driving signal generation circuit 331_2 may generate a first pull-up driving signal PU<1> having a logic low level when the node nd332 is driven by the power supply voltage VDD. The first pull-up/pull-down driving signal generation circuit 331_2 may drive the node nd331 with the ground voltage VSS when the logic level of the write delay signal WTD is a logic high level and the logic level of the first delay clock QD1 is a logic high level. The first pull-up/pull-down driving signal generation circuit 331_2 may drive the node nd332 with the ground voltage VSS when the logic level of the write delay signal WTD is a logic low level and the logic level of the first delay clock QD1 is a logic high level. The first pull-up/pull-down driving signal generation circuit 331_2 may generate a first pull-down driving signal PD<1> having a logic high level when the node nd331 is driven by the ground voltage VSS. The first pull-up/pull-down driving signal generation circuit 331_2 may generate the first pull-up driving signal PU<1> having a logic high level when the node nd332 is driven by the ground voltage VSS.

The first driving circuit 332 may be implemented by using a PMOS transistor 332_1 that is connected between the power supply voltage VDD and a node nd333 and an NMOS transistor 332_2 that is connected between the node nd333 and the ground voltage VSS. The PMOS transistor 332_1 may generate the first write output control signal WPOUT<1> having a logic high level by driving the node nd333 with the power supply voltage VDD when the logic level of the first pull-up driving signal PU<1> is a logic low level. The NMOS transistor 332_2 may generate the first write output control signal WPOUT<1> having a logic low level by driving the node nd333 with the ground voltage VSS when the logic level of the first pull-down driving signal PD<1> is a logic high level.

Figure 10:
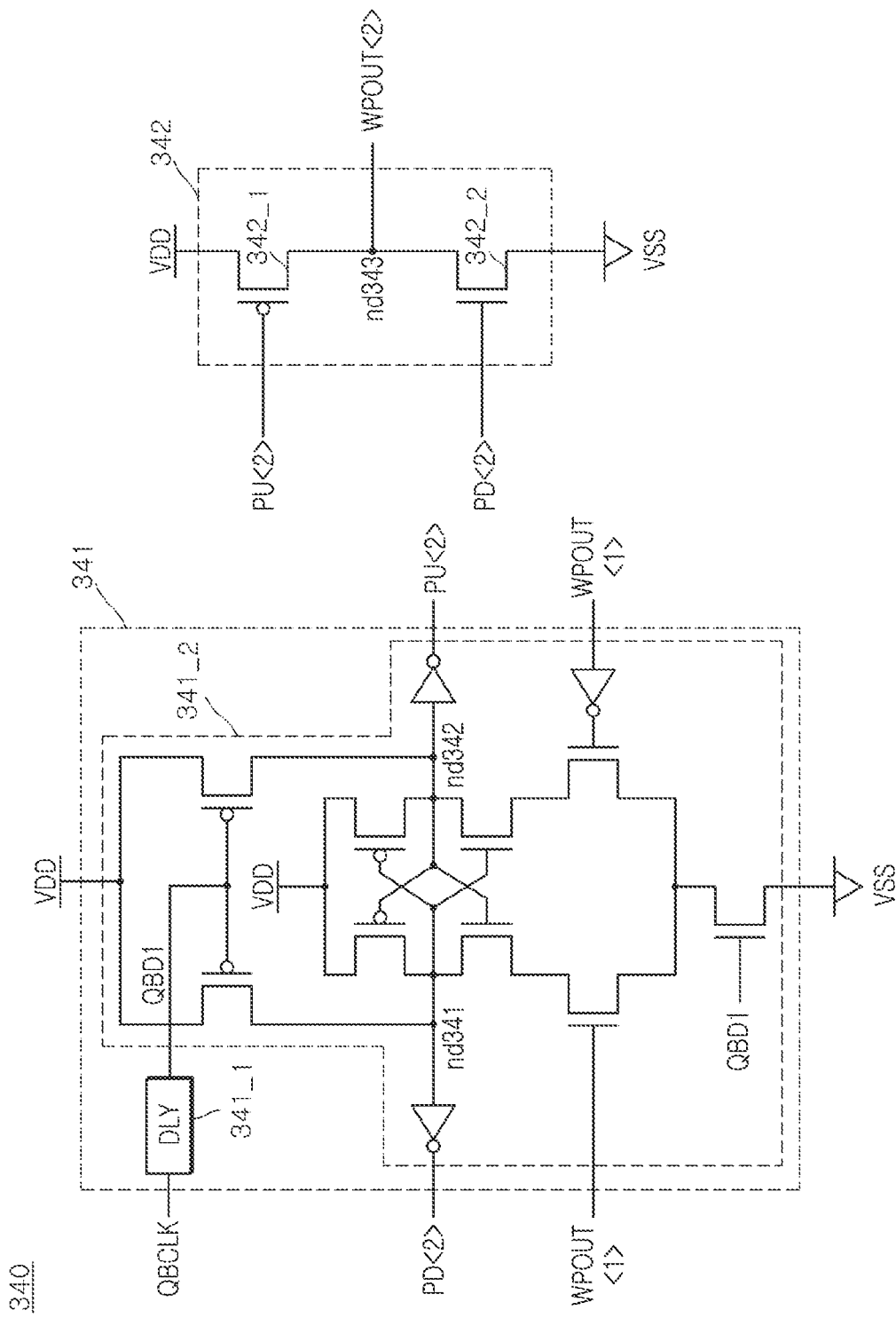
FIG. 10 is a diagram illustrating a construction of a second clock driving circuit that is included in the output control signal generation circuit illustrated in FIG. 8.

FIG. 10 is a diagram illustrating a construction according to an embodiment of the second clock driving circuit 340 that is included in the output control signal generation circuit 232_2. The second clock driving circuit 340 may include a second driving signal generation circuit 341 and a second driving circuit 342.

The second driving signal generation circuit 341 may include a second delay circuit (DLY) 341_1 and a second pull-up/pull-down driving signal generation circuit 341_2.

The second delay circuit 341_1 may generate a second delay clock QBD1 by inverting and delaying the fourth internal clock QBCLK.

The second pull-up/pull-down driving signal generation circuit 341_2 may drive a node nd341 and a node nd342 with the power supply voltage VDD when the logic level of the second delay clock QBD1 is a logic low level. The second pull-up/pull-down driving signal generation circuit 341_2 may generate a second pull-down driving signal PD<2> having a logic low level when the node nd341 is driven by the power supply voltage VDD. The second pull-up/pull-down driving signal generation circuit 341_2 may generate a second pull-up driving signal PU<2> having a logic low level when the node nd332 is driven by the power supply voltage VDD. The second pull-up/pull-down driving signal generation circuit 341_2 may drive the node nd341 with the ground voltage VSS when the logic level of the first output control signal WOUT<1> is a logic high level and the logic level of the second delay clock QBD1 is a logic high level. The second pull-up/pull-down driving signal generation circuit 341_2 may drive the node nd342 with the ground voltage VSS when the logic level of the first output control signal WOUT<1> is a logic low level and the logic level of the second delay clock QBD1 is a logic high level. The second pull-up/pull-down driving signal generation circuit 341_2 may generate the second pull-down driving signal PD<2> having a logic high level when the node nd341 is driven by the ground voltage VSS. The second pull-up/pull-down driving signal generation circuit 341_2 may generate the second pull-up driving signal PU<2> having a logic high level when the node nd332 is driven by the ground voltage VSS.

The second driving circuit 342 may be implemented by using a PMOS transistor 342_1 that is connected between the power supply voltage VDD and a node nd343 and an NMOS transistor 342_2 that is connected between the node nd343 and the ground voltage VSS. The PMOS transistor 342_1 may generate the second write output control signal WPOUT<2> having a logic high level by driving the node nd343 with the power supply voltage VDD when the logic level of the second pull-up driving signal PU<2> is a logic low level. The NMOS transistor 342_2 may generate the second write output control signal WPOUT<2> having a logic low level by driving the node nd343 with the ground voltage VSS when the logic level of the second pull-down driving signal PD<2> is a logic high level.

Figure 11:
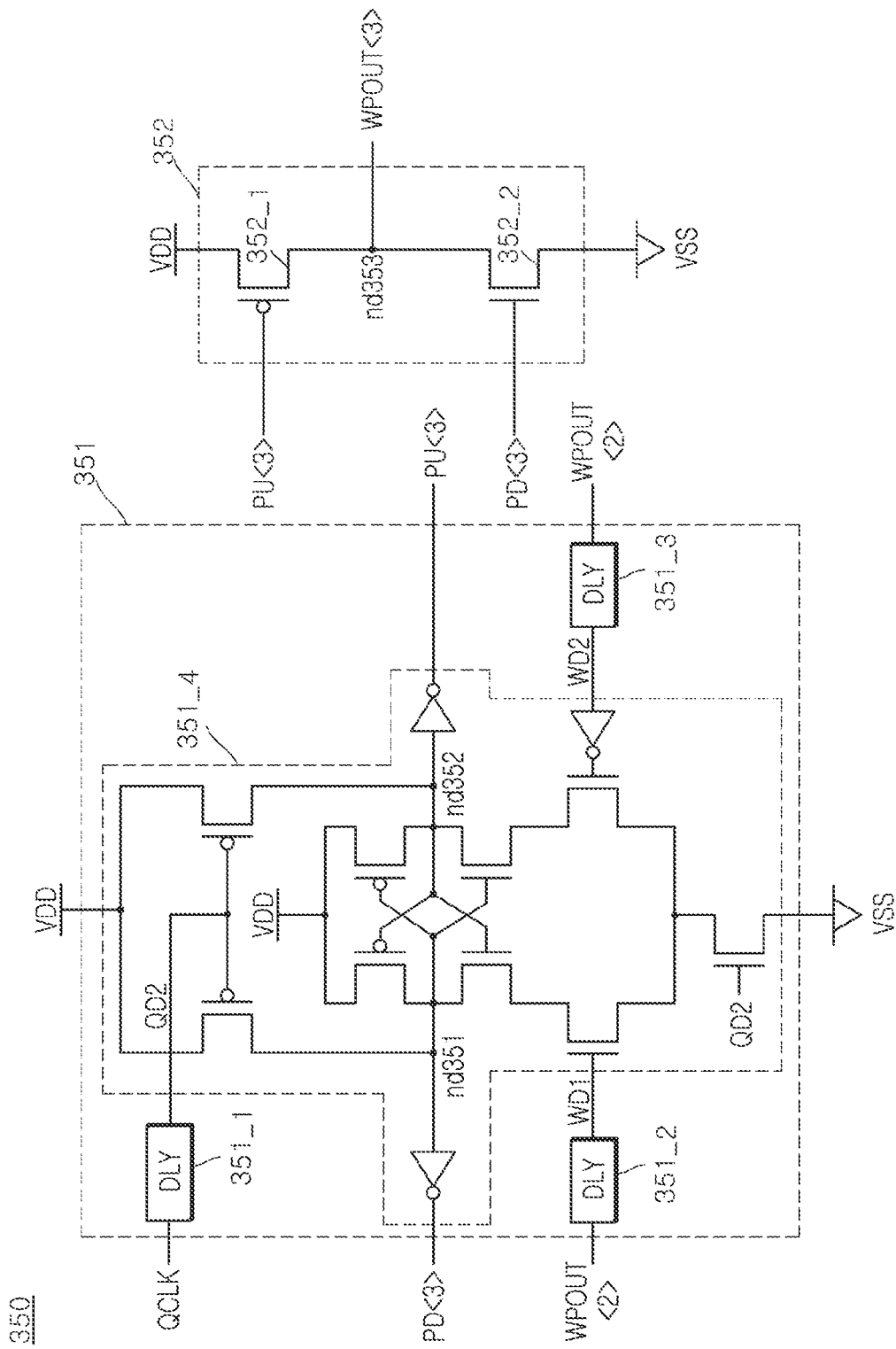
FIG. 11 is a diagram illustrating a construction of a third clock driving circuit that is included in the output control signal generation circuit illustrated in FIG. 8.

FIG. 11 is a diagram illustrating a construction according to an embodiment of the third clock driving circuit 350 that is included in the output control signal generation circuit 232_2. The third clock driving circuit 350 may include a third driving signal generation circuit 351 and a third driving circuit 352.

The third driving signal generation circuit 351 may include a third delay circuit (DLY) 351_1, a fourth delay circuit (DLY) 351_2, a fifth delay circuit (DLY) 351_3, and a third pull-up/pull-down driving signal generation circuit 351_4.

The third delay circuit 351_1 may generate a third delay clock QD2 by inverting and delaying the second internal clock QCLK.

The fourth delay circuit 351_2 may generate a first output delay signal WD1 by delaying the second output control signal WPOUT<2>.

The fifth delay circuit 351_3 may generate a second output delay signal WD2 by delaying the second output control signal WPOUT<2>.

The third pull-up/pull-down driving signal generation circuit 351_4 may drive a node nd351 and a node nd352 with the power supply voltage VDD when the logic level of the third delay clock QD2 is a logic low level. The third pull-up/pull-down driving signal generation circuit 351_4 may generate a third pull-down driving signal PD<3> having a logic low level when the node nd351 is driven by the power supply voltage VDD. The third pull-up/pull-down driving signal generation circuit 351_4 may generate a third pull-up driving signal PU<3> having a logic low level when the node nd352 is driven by the power supply voltage VDD. The third pull-up/pull-down driving signal generation circuit 351_4 may drive the node nd351 with the ground voltage VSS when the logic level of the first output delay signal WD1 is a logic high level and the logic level of the third delay clock QD2 is a logic high level. The third pull-up/pull-down driving signal generation circuit 351_4 may drive the node nd352 with the ground voltage VSS when the logic level of the second output delay signal WD2 is a logic low level and the logic level of the third delay clock QD2 is a logic high level. The third pull-up/pull-down driving signal generation circuit 351_4 may generate the third pull-down driving signal PD<3> having a logic high level when the node nd351 is driven by the ground voltage VSS. The third pull-up/pull-down driving signal generation circuit 351_4 may generate the third pull-up driving signal PU<3> having a logic high level when the node nd352 is driven by the ground voltage VSS.

The third driving circuit 352 may be implemented by using a PMOS transistor 352_1 that is connected between the power supply voltage VDD and a node nd353 and an NMOS transistor 352_2 that is connected between the node nd353 and the ground voltage VSS. The PMOS transistor 352_1 may generate the third write output control signal WPOUT<3> having a logic high level by driving the node nd353 with the power supply voltage VDD when the logic level of the third pull-up driving signal PU<3> is a logic low level. The NMOS transistor 352_2 may generate the third write output control signal WPOUT<3> having a logic low level by driving the node nd353 with the ground voltage VSS when the logic level of the third pull-down driving signal PD<3> is a logic high level.

Figure 12:
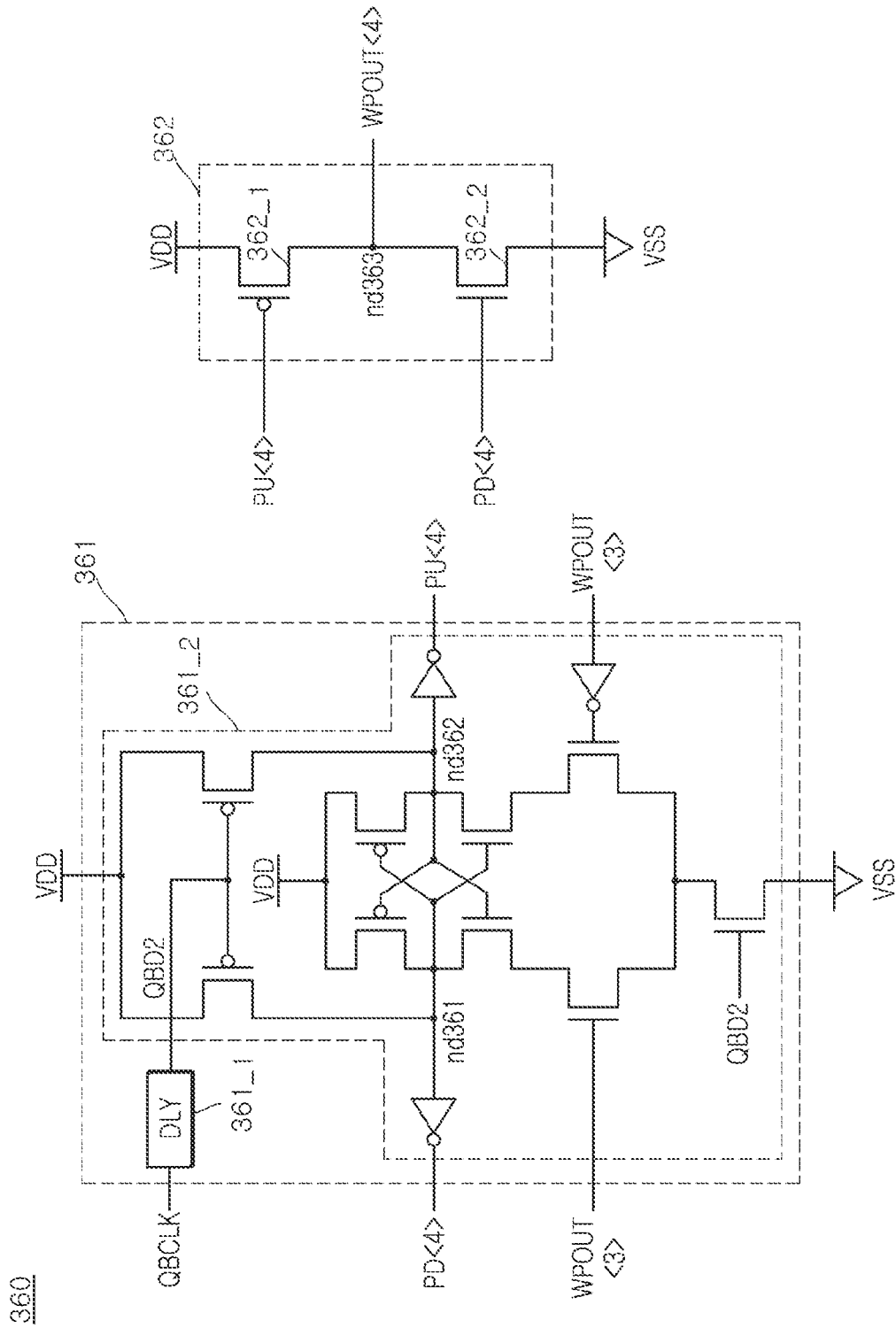
FIG. 12 is a diagram illustrating a construction of a fourth clock driving circuit that is included in the output control signal generation circuit illustrated in FIG. 8.

FIG. 12 is a diagram illustrating a construction according to an embodiment of the fourth clock driving circuit 360 that is included in the output control signal generation circuit 232_2. The fourth clock driving circuit 360 may include a fourth driving signal generation circuit 361 and a fourth driving circuit 362.

The fourth driving signal generation circuit 361 may include a sixth delay circuit (DLY) 361_1 and a fourth pull-up/pull-down driving signal generation circuit 361_2.

The sixth delay circuit 361_1 may generate a fourth delay clock QBD2 by inverting and delaying the fourth internal clock QBCLK. The fourth pull-up/pull-down driving signal generation circuit 361_2 may drive a node nd361 and a node nd362 with the power supply voltage VDD when the logic level of the fourth delay clock QBD2 is a logic low level. The fourth pull-up/pull-down driving signal generation circuit 361_2 may generate a fourth pull-down driving signal PD<4> having a logic low level when the node nd361 is driven by the power supply voltage VDD. The fourth pull-up/pull-down driving signal generation circuit 361_2 may generate a fourth pull-up driving signal PU<4> having a logic low level when the node nd362 is driven by the power supply voltage VDD. The fourth pull-up/pull-down driving signal generation circuit 361_2 may drive the node nd361 with the ground voltage VSS when the logic level of the third output control signal WOUT<3> is a logic high level and the logic level of the sixth delay clock QBD2 is a logic high level. The fourth pull-up/pull-down driving signal generation circuit 361_2 may drive the node nd362 with the ground voltage VSS when the logic level of the third output control signal WOUT<3> is a logic low level and the logic level of the fourth delay clock QBD2 is a logic high level. The fourth pull-up/pull-down driving signal generation circuit 361_2 may generate the fourth pull-down driving signal PD<4> having a logic high level when the node nd361 is driven by the ground voltage VSS. The fourth pull-up/pull-down driving signal generation circuit 361_2 may generate the fourth pull-up driving signal PU<4> having a logic high level when the node nd362 is driven by the ground voltage VSS.

The fourth driving circuit 362 may be implemented by using a PMOS transistor 362_1 that is connected between the power supply voltage VDD and a node nd363 and an NMOS transistor 362_2 that is connected between the node nd363 and the ground voltage VSS. The PMOS transistor 362_1 may generate the fourth write output control signal WPOUT<4> having a logic high level by driving the node nd363 with the power supply voltage VDD when the logic level of the fourth pull-up driving signal PU<4> is a logic low level. The NMOS transistor 362_2 may generate the fourth write output control signal WPOUT<4> having a logic low level by driving the node nd363 with the ground voltage VSS when the logic level of the fourth pull-down driving signal PD<4> is a logic high level.

Figure 13:
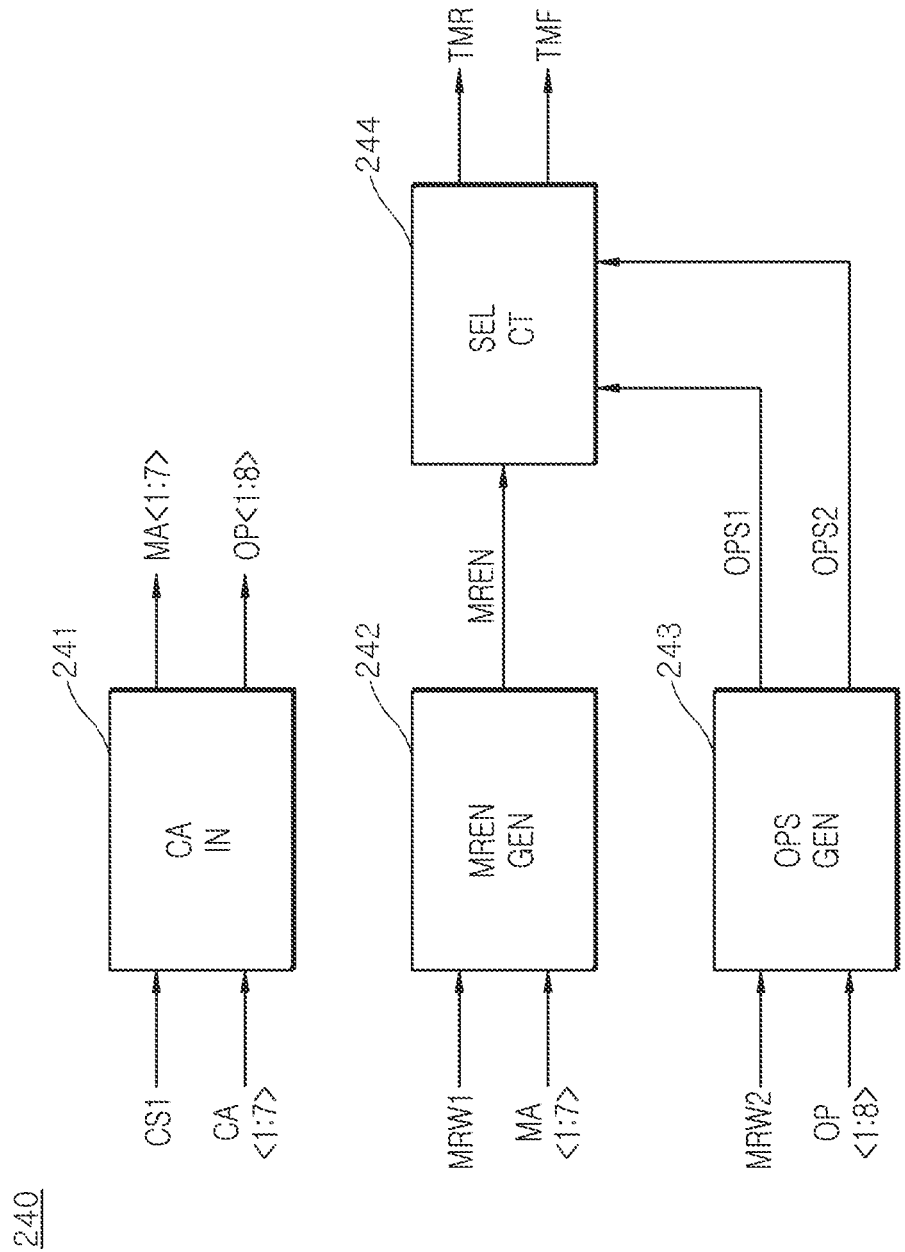
FIG. 13 is a block diagram illustrating a construction of a test signal generation circuit that is included in the first memory device illustrated in FIG. 2.

FIG. 13 is a block diagram illustrating a construction according to an embodiment of the test signal generation circuit 240 that is included in the first memory device 20. The test signal generation circuit 240 may include a command address input circuit (CA IN) 241, a test enable signal generation circuit (MREN GEN) 242, an operation signal generation circuit (OPS GEN) 243, and a selection transfer circuit (SEL CT) 244.

The command address input circuit 241 may generate first to seventh mode information MA<1:7> and first to eighth operation information OP<1:8> based on the first to seventh command addresses CA<1:7> depending on a logic level of the first chip selection signal CS1 in the first mode register write operation and the second mode register write operation. The command address input circuit 241 may generate the first to seventh mode information MA<1:7> based on the first to seventh command addresses CA<1:7> when the logic level of the first chip selection signal CS1 is a logic low level in the first mode register write operation. The command address input circuit 241 may generate the first to seventh operation information OP<1:7> based on the first to seventh command addresses CA<1:7> when the logic level of the first chip selection signal CS1 is a logic low level and generate the eighth operation information OP<8> based on the seventh command address CA<7> when the logic level of the first chip selection signal CS1 is a logic high level, in the second mode register write operation.

The test enable signal generation circuit 242 may generate a test enable signal MREN by detecting a logic level combination of the first to seventh mode information MA<1:7> in the first mode register write operation. The test enable signal generation circuit 242 may generate the test enable signal MREN that is enabled when the first to seventh mode information MA<1:7> has a logic level combination for performing the test mode, when the first mode write command MRW1 is enabled.

The operation signal generation circuit 243 may generate the first operation signal OPS1 and the second operation signal OPS2 by detecting a logic level combination of the first to eighth operation information OP<1:8> in the second mode register write operation. The operation signal generation circuit 243 may generate a first operation signal OPS1 that is enabled when the first to eighth operation information OP<1:8> have a logic level combination for performing a first operation mode when the second mode write command MRW2 is enabled. The operation signal generation circuit 243 may generate a second operation signal OPS2 that is enabled when the first to eighth operation information OP<1:8> have a logic level combination for performing a second operation mode when the second mode write command MRW2 is enabled. The first operation mode may be set as an operation of multiple bits that are included in the data DATA being output so that the multiple bits are synchronized with timing at which a rising edge of the write clock WCK is generated. The second operation mode may be set as an operation of multiple bits that are included in the data DATA being output so that the multiple bits are synchronized with timing at which a falling edge of the write clock WCK is generated.

The selection transfer circuit 244 may generate the rising test signal TMR and the falling test signal TMF from the test enable signal MREN based on the logic levels of the first operation signal OPS1 and the second operation signal OPS2. The selection transfer circuit 244 may output the test enable signal MREN as the rising test signal TMR when the first operation signal OPS1 is enabled to a logic high level. The selection transfer circuit 244 may generate the rising test signal TMR having a logic high level and the falling test signal TMF having a logic low level, when the first operation signal OPS1 is enabled to a logic high level and the test enable signal MREN is enabled to a logic high level. The selection transfer circuit 244 may output the test enable signal MREN as the falling test signal TMF when the second operation signal OPS2 is enabled to a logic high level. The selection transfer circuit 244 may generate the rising test signal TMR having a logic low level and the falling test signal TMF having a logic high level, when the second operation signal OPS2 is enabled to a logic high level and the test enable signal MREN is enabled to a logic high level.

A logic level combination of the command addresses for performing the first mode register write operation and the second mode register write operation and a logic level combination of the command addresses for generating the mode information and the operation information according to an embodiment of the present disclosure are described as follows with reference to FIG. 14.

The first to seventh command addresses CA<1:7> for performing the first mode register write operation may correspond to a case in which the logic level of the first command address CA<1> is a logic low level, the logic level of the second command address CA<2> is a logic low level, the logic level of the third command address CA<3> is a logic low level, the logic level of the fourth command address CA<4> is a logic high level, the logic level of the fifth command address CA<5> is a logic high level, the logic level of the sixth command address CA<6> is a logic low level, and the logic level of the seventh command address CA<7> is a logic high level, when the first chip selection signal CS1 having a logic high level is input.

The command decoder 210 may generate the first mode write command MRW1 when the first to seventh command addresses CA<1:7> have a logic level combination for performing the first mode register write operation.

The first to seventh command addresses CA<1:7> for performing the second mode register write operation may correspond to a case in which the logic level of the first command address CA<1> is a logic low level, the logic level of the second command address CA<2> is a logic low level, the logic level of the third command address CA<3> is a logic low level, the logic level of the fourth command address CA<4> is a logic high level, the logic level of the fifth command address CA<5> is a logic low level, and the logic level of the sixth command address CA<6> is a logic low level, when the first chip selection signal CS1 having a logic high level is input.

The command decoder 210 may generate the second mode write command MRW2 when the first to sixth command addresses CA<1:6> have a logic level combination for performing the second mode register write operation.

In the first mode register write operation, when the logic level of the first chip selection signal CS1 is a logic low level, the first to seventh command addresses CA<1:7> may be generated as the first to seventh mode information MA<1:7>, respectively.

The first to seventh mode information MA<1:7> for performing the test mode may correspond to a case in which the logic level of the first mode information MA<1> is a logic high level, the logic level of the second mode information MA<2> is a logic high level, the logic level of the third mode information MA<3> is a logic high level, the logic level of the fourth mode information MA<4> is a logic high level, the logic level of the fifth mode information MA<1> is a logic low level, the logic level of the sixth mode information MA<2> is a logic low level, and the logic level of the seventh mode information MA<7> is a logic low level.

In the second mode register write operation, when the logic level of the first chip selection signal CS1 is a logic low level, the first to seventh command addresses CA<1:7> may be generated as the first to seventh operation information MA<1:7>, respectively. When the logic level of the first chip selection signal CS1 is a logic high level, the seventh command address CA<7> may be generated as the eighth operation information MA<8>.

The first to eighth operation information OP<1:8> for performing the first operation mode may correspond to a case in which the logic level of the first operation information OP<1> is a logic high level, the logic level of the second operation information OP<2> is a logic high level, the logic level of the third operation information OP<3> is a logic high level, the logic level of the fourth operation information OP<4> is a logic high level, the logic level of the fifth operation information OP<1> is a logic low level, the sixth operation information OP<2> is a logic low level, the logic level of the seventh operation information OP<7> is a logic low level, and the logic level of the eighth operation information OP<8> is a logic low level. The operation signal generation circuit 243 may generate the first operation signal OPS1 that is enabled when the first to eighth operation information OP<1:8> have a logic level combination for performing the first operation mode, when the second mode write command MRW2 is enabled. A logic level combination of the first to eighth operation information OP<1:8> for performing the first operation mode may be variously set depending on embodiments.

The first to eighth operation information OP<1:8> for performing the second operation mode may correspond to a case in which the logic level of the first operation information OP<1> is a logic high level, the logic level of the second operation information OP<2> is a logic high level, the logic level of the third operation information OP<3> is a logic high level, the fourth operation information OP<4> is a logic high level, the logic level of the fifth operation information OP<1> is a logic low level, the logic level of the sixth operation information OP<2> is a logic low level, the logic level of the seventh operation information OP<7> is a logic low level, and the logic level of the eighth operation information OP<8> is a logic high level. The operation signal generation circuit 243 may generate the second operation signal OPS2 that is enabled when the first to eighth operation information OP<1:8> have a logic level combination for performing the second operation mode, when the second mode write command MRW2 is enabled. A logic level combination of the first to eighth operation information OP<1:8> for performing the second operation mode may be variously set depending on embodiments.

Figure 15:
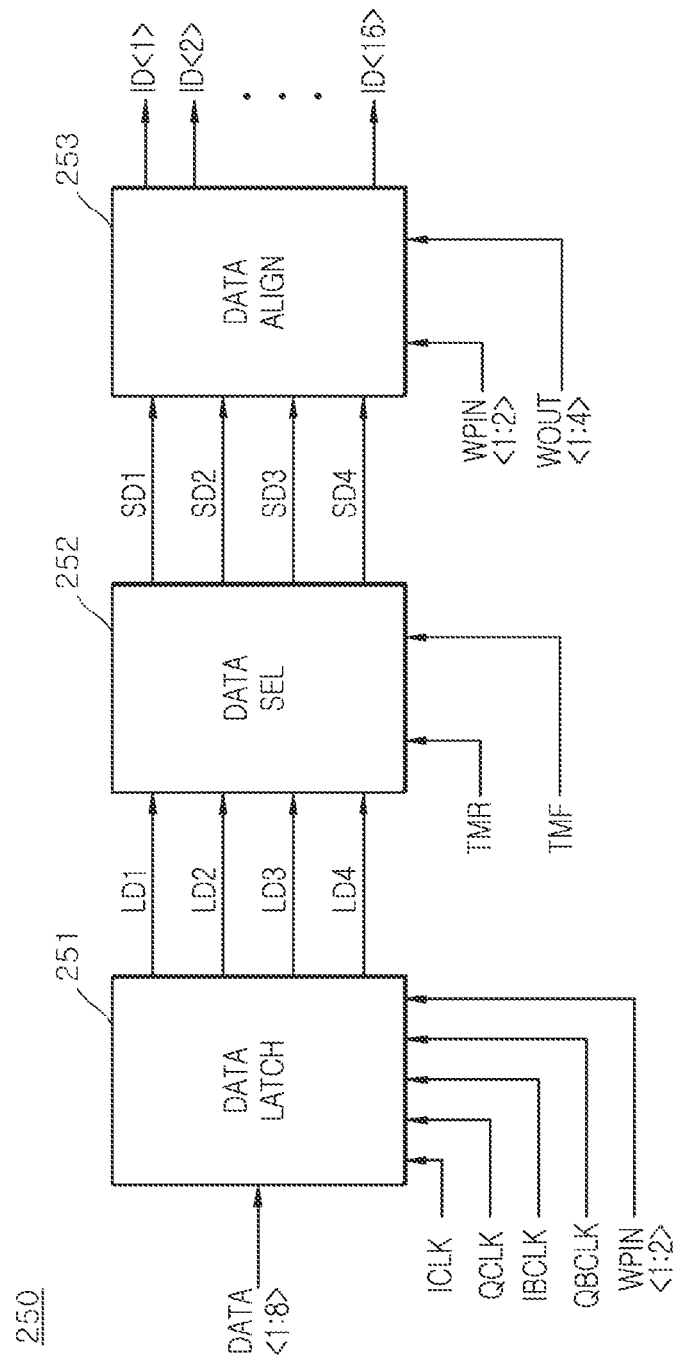
FIG. 15 is a block diagram illustrating a construction of a data processing circuit that is included in the first memory device illustrated in FIG. 2.

FIG. 15 is a block diagram illustrating a construction according to an embodiment of the data processing circuit 250 that is included in the first memory device 20. The data processing circuit 250 may include a data latch circuit (DATA LATCH) 251, a data selection circuit (DATA SEL) 252, and a data alignment circuit (DATA ALIGN) 253.

The data latch circuit 251 may receive first to eighth data DATA<1:8>, in synchronization with the first internal clock ICLK, the second internal clock QCLK, the third internal clock IBCLK, and the fourth internal clock QBCLK. The data latch circuit 251 may generate first latch data LD1, second latch data LD2, third latch data LD3, and fourth latch data LD4, from the first to eighth data DATA<1:8> that are input in synchronization with the first write input control signal WPIN<1> and the second write input control signal WPIN<2>. The first to eighth data DATA<1:8> may mean first to eighth bits that are sequentially input in series. The first latch data LD1, the second latch data LD2, the third latch data LD3, and the fourth latch data LD4 may be generated to include multiple bits.

The data selection circuit 252 may generate first selection data SD1, second selection data SD2, third selection data SD3, and fourth selection data SD4 from the first latch data LD1, the second latch data LD2, the third latch data LD3, and the fourth latch data LD4 based on the logic levels of the rising test signal TMR and the falling test signal TMF. The data selection circuit 252 may generate the first selection data SD1 and the second selection data SD2 from the first latch data LD1 when the rising test signal TMR is enabled. The data selection circuit 252 may generate the third selection data SD3 and the fourth selection data SD4 from the third latch data LD3 when the rising test signal TMR is enabled. The data selection circuit 252 may generate the first selection data SD1, the second selection data SD2, the third selection data SD3, and the fourth selection data SD4 by excluding the second latch data LD2 and the fourth latch data LD4 when the rising test signal TMR is enabled. The data selection circuit 252 may generate the first selection data SD1 and the second selection data SD2 from the second latch data LD2 when the falling test signal TMF is enabled. The data selection circuit 252 may generate the third selection data SD3 and the fourth selection data SD4 from the fourth latch data LD4 when the falling test signal TMF is enabled. The data selection circuit 252 may generate the first selection data SD1, the second selection data SD2, the third selection data SD3, and the fourth selection data SD4 by excluding the first latch data LD1 and the third latch data LD3 when the falling test signal TMF is enabled. The first selection data SD1, the second selection data SD2, the third selection data SD3, and the fourth selection data SD4 may be generated to include multiple bits.

The data alignment circuit 253 may generate first to sixteenth internal data ID<1:16> by aligning the first selection data SD1, the second selection data SD2, the third selection data SD3, and the fourth selection data SD4, based on the first write input control signal WPIN<1> and the second write input control signal WPIN<2>, and the first write output control signal WPOU<1>, the second write output control signal WPOU<2>, the third write output control signal WPOU<3>, and the fourth write output control signal WPOU<4>. The first to sixteenth internal data ID<1:16> may mean first to sixteenth bits that are generated in parallel.

Figure 16:
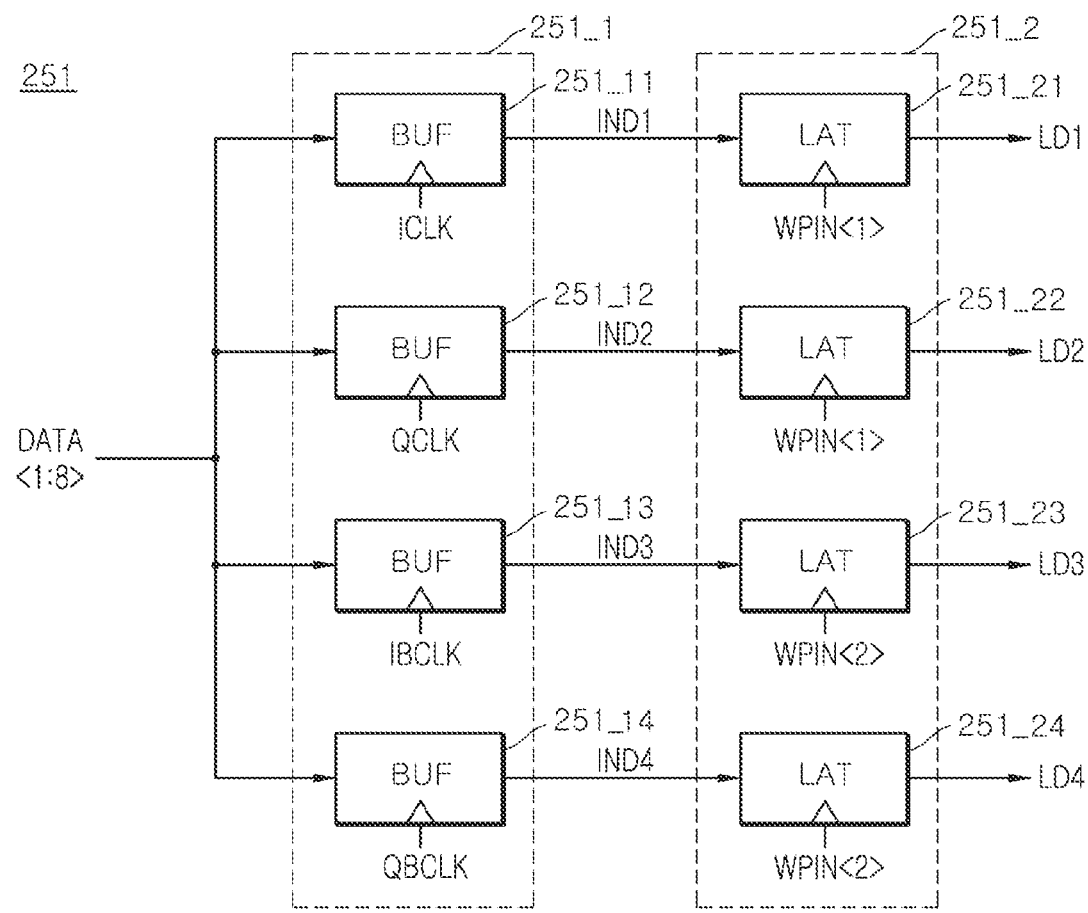
FIG. 16 is a block diagram illustrating a construction of a data latch circuit that is included in the data processing circuit illustrated in FIG. 15.

FIG. 16 is a block diagram illustrating a construction according to an embodiment of the data latch circuit 251 that is included in the data processing circuit 250. The data latch circuit 251 may include a buffer circuit 251_1 and a latch circuit 251_2.

The buffer circuit 251_1 may include a first buffer (BUF) 251_11, a second buffer (BUF) 251_12, a third buffer (BUF) 251_13, and a fourth buffer (BUF) 251_14. The first buffer 251_11 may generate first input data IND1 by buffering data that is input in synchronization with a rising edge of the first internal clock ICLK, among the first to eighth data DATA<1:8>. The second buffer 251_12 may generate second input data IND2 by buffering data that is input in synchronization with a rising edge of the second internal clock QCLK, among the first to eighth data DATA<1:8>. The third buffer 251_13 may generate third input data IND3 by buffering data that is input in synchronization with a rising edge of the third internal clock IBCLK, among the first to eighth data DATA<1:8>. The fourth buffer 251_14 may generate fourth input data IND4 by buffering data that is input in synchronization with a rising edge of the fourth internal clock QBCLK, among the first to eighth data DATA<1:8>. The latch circuit 251_2 may include a first input latch (LAT) 251_21, a second input latch (LAT) 251_22, a third input latch (LAT) 251_23, and a fourth input latch (LAT) 251_24. The first input latch 251_21 may latch the first input data IND1 when the first write input control signal WPIN<1> is enabled to a logic high level. The first input latch 251_21 may output, as first latch data LD1, the first input data IND1 that has been latched when the first write input control signal WPIN<1> is enabled to a logic high level. The second input latch 251_22 may latch the second input data IND2 when the first write input control signal WPIN<1> is enabled to a logic high level. The second input latch 251_22 may output, as second latch data LD2, the second input data IND2 that has been latched when the first write input control signal WPIN<1> is enabled to a logic high level. The third input latch 251_23 may latch the third input data IND3 when the second write input control signal WPIN<2> is enabled to a logic high level. The third input latch 251_23 may output, as third latch data LD3, the third input data IND3 that has been latched when the second write input control signal WPIN<2> is enabled to a logic high level. The fourth input latch 251_24 may latch the fourth input data IND4 when the second write input control signal WPIN<2> is enabled to a logic high level. The fourth input latch 251_24 may output, as fourth latch data LD4, the fourth input data IND4 that has been latched when the second write input control signal WPIN<2> is enabled to a logic high level.

Figure 17:
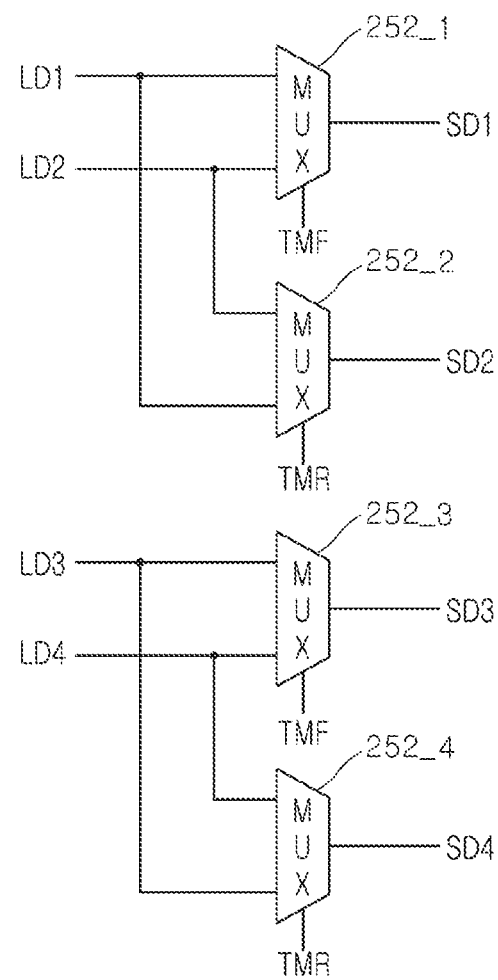
FIG. 17 is a block diagram illustrating a construction of a data selection circuit that is included in the data processing circuit illustrated in FIG. 15.

FIG. 17 is a block diagram illustrating a construction according to an embodiment of the data selection circuit 252 that is included in the data processing circuit 250. The data selection circuit 252 may include a first selection transferrer (MUX) 252_1, a second selection transferrer (MUX) 252_2, a third selection transferrer (MUX) 252_3, and a fourth selection transferrer (MUX) 252_4.

The first selection transferrer 252_1 may output any one of the first latch data LD1 and the second latch data LD2 as the first selection data SD1, based on a logic level of the test falling signal TMF. The first selection transferrer 252_1 may output the first latch data LD1 as the first selection data SD1 when the test falling signal TMF is disabled to a logic low level. The first selection transferrer 252_1 may output the second latch data LD2 as the first selection data SD1 when the test falling signal TMF is enabled to a logic high level.

The second selection transferrer 252_2 may output any one of the first latch data LD1 and the second latch data LD2 as the second selection data SD2 based on a logic level of the test rising signal TMR. The second selection transferrer 252_2 may output the second latch data LD2 as the second selection data SD2 when the test rising signal TMR is disabled to a logic low level. The second selection transferrer 252_2 may output the first latch data LD1 as the second selection data SD2 when the test rising signal TMR is enabled to a logic high level.

The third selection transferrer 252_3 may output any one of the third latch data LD3 and the fourth latch data LD4 as the third selection data SD3 based on a logic level of the test falling signal TMF. The third selection transferrer 252_3 may output the third latch data LD3 as the third selection data SD3 when the test falling signal TMF is disabled to a logic low level. The third selection transferrer 252_3 may output the fourth latch data LD4 as the third selection data SD3 when the test falling signal TMF is enabled to a logic high level.

The fourth selection transferrer 252_4 may output any one of the third latch data LD3 and the fourth latch data LD4 as the fourth selection data SD4 based on a logic level of the test rising signal TMR. The fourth selection transferrer 252_4 may output the fourth latch data LD4 as the fourth selection data SD4 when the test rising signal TMR is disabled to a logic low level. The fourth selection transferrer 252_4 may output the third latch data LD3 as the fourth selection data SD4 when the test rising signal TMR is enabled to a logic high level.

Figure 18:
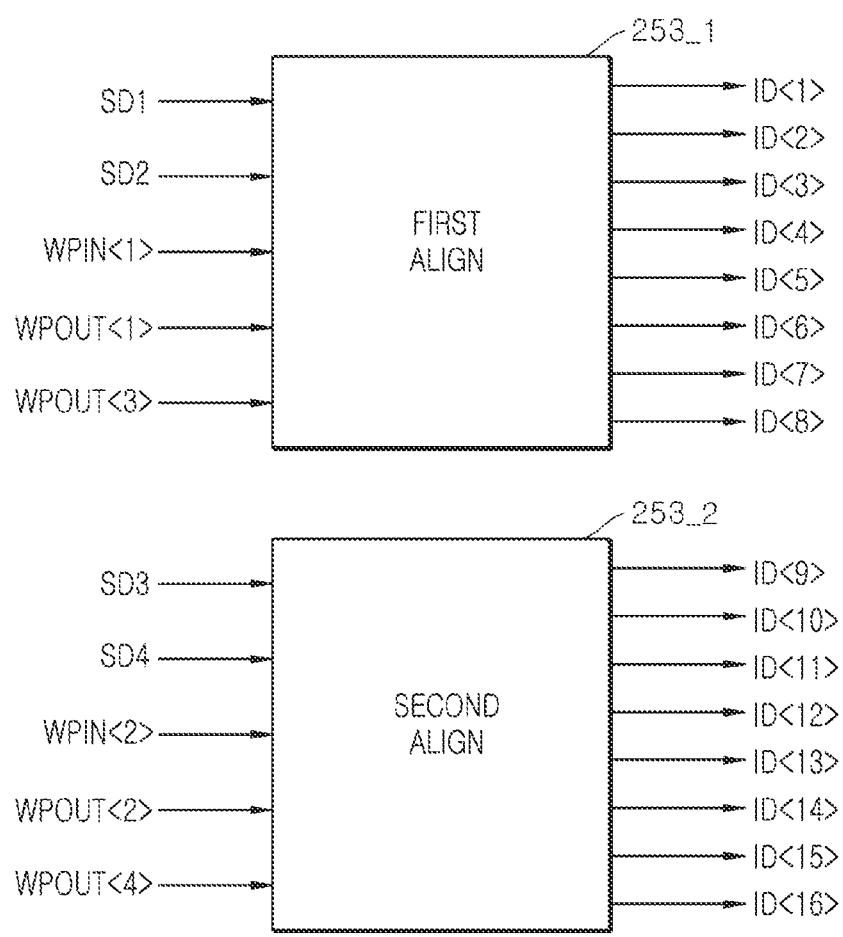
FIG. 18 is a block diagram illustrating a construction of a data alignment circuit that is included in the data processing circuit illustrated in FIG. 15.

FIG. 18 is a block diagram illustrating a construction according to an embodiment of the data alignment circuit 253 that is included in the data processing circuit 250. The data alignment circuit 253 may include a first alignment circuit (FIRST ALIGN) 253_1 and a second alignment circuit (SECOND ALIGN) 253_2.

The first alignment circuit 253_1 may generate the first to eighth internal data ID<1:8> by aligning the first selection data SD1 and the second selection data SD2, based on the first write input control signal WPIN<1>, the first write output control signal WPOUT<1>, and the third write output control signal WPOUT<3>. The first alignment circuit 253_1 may receive bits that are included in the first selection data SD1 and the second selection data SD2 at timing at which the first write input control signal WPIN<1>, the first write output control signal WPOUT<1>, and the third write output control signal WPOUT<3> are enabled, and may generate the first to eighth internal data ID<1:8> by aligning the received bits that are included in the first selection data SD1 and the second selection data SD2.

The second alignment circuit 253_2 may generate the ninth to sixteenth internal data ID<9:16> by aligning the third selection data SD3 and the fourth selection data SD4, based on the second write input control signal WPIN<2>, the second write output control signal WPOUT<2>, and the fourth write output control signal WPOUT<4>. The second alignment circuit 253_2 may receive bits that are included in the third selection data SD3 and the fourth selection data SD2 at timing at which the second write input control signal WPIN<2>, the second write output control signal WPOUT<2>, and the fourth write output control signal WPOUT<4> are enabled, and may generate the ninth to sixteenth internal data ID<9:16> by aligning the received bits that are included in the third selection data SD3 and the fourth selection data SD4.

Figure 19:
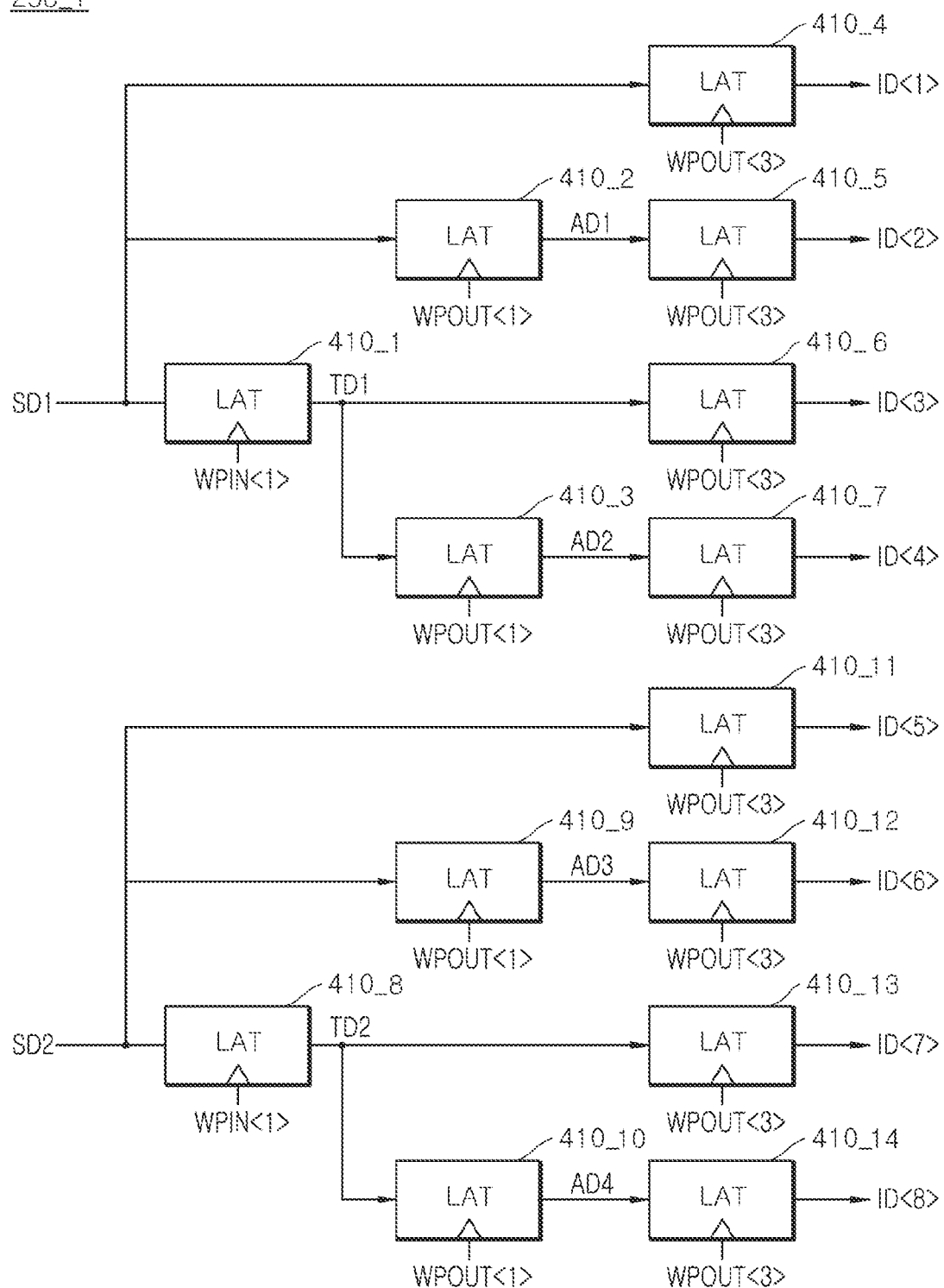
FIG. 19 is a block diagram illustrating a construction of a first alignment circuit that is included in the data alignment circuit illustrated in FIG. 18.

FIG. 19 is a block diagram illustrating a construction according to an embodiment of the first alignment circuit 253_1 that is included in the data alignment circuit 253. The first alignment circuit 253_1 may include a first output latch (LAT) 410_1, a second output latch (LAT) 410_2, a third output latch (LAT) 410_3, a fourth output latch (LAT) 410_4, a fifth output latch (LAT) 410_5, a sixth output latch (LAT) 410_6, a seventh output latch (LAT) 410_7, an eighth output latch (LAT) 410_8, a ninth output latch (LAT) 410_9, a tenth output latch (LAT) 410_10, an eleventh output latch (LAT) 410_11, a twelfth output latch (LAT) 410_12, a thirteenth output latch (LAT) 410_13, and a fourteenth output latch (LAT) 410_14.

The first output latch 410_1 may latch the first selection data SD1 at timing at which the first write input control signal WPIN<1> having a logic high level is input, and may output, as first transfer data TD1, the first selection data SD1 that has been latched.

The second output latch 410_2 may latch the first selection data SD1 at timing at which the first write output control signal WPOUT<1> having a logic high level is input, and may output, as first alignment data AD1, the first selection data SD1 that has been latched.

The third output latch 410_3 may latch the first transfer data TD1 at timing at which the first write output control signal WPOUT<1> having a logic high level is input, and may output, as second alignment data AD2, the first transfer data TD1 that has been latched.

The fourth output latch 410_4 may latch the first selection data SD1 at timing at which the third write output control signal WPOUT<3> having a logic high level is input, and may output, as the first internal data ID<1>, the first selection data SD1 that has been latched.

The fifth output latch 410_5 may latch the first alignment data AD1 at timing at which the third write output control signal WPOUT<3> having a logic high level is input, and may output, as the second internal data ID<2>, the first alignment data AD1 that has been latched.

The sixth output latch 410_6 may latch the first transfer data TD1 at timing at which the third write output control signal WPOUT<3> having a logic high level is input, and may output, as the third internal data ID<3>, the first transfer data TD1 that has been latched.

The seventh output latch 410_7 may latch the second alignment data AD2 at timing at which the third write output control signal WPOUT<3> having a logic high level is input, and may output, as the fourth internal data ID<4>, the second alignment data AD2 that has been latched.

The eighth output latch 410_8 may latch the second selection data SD2 at timing at which the first write input control signal WPIN<1> having a logic high level is input, and may output, as second transfer data TD2, the second selection data SD2 that has been latched.

The ninth output latch 410_9 may latch the second selection data SD2 at timing at which the first write output control signal WPOUT<1> having a logic high level is input, and may output, as third alignment data AD3, the second selection data SD2 that has been latched.

The tenth output latch 410_10 may latch the second transfer data TD2 at timing at which the first write output control signal WPOUT<1> having a logic high level is input, and may output, as fourth alignment data AD4, the second transfer data TD2 that has been latched.

The eleventh output latch 410_11 may latch the second selection data SD2 at timing at which the third write output control signal WPOUT<3> having a logic high level is input, and may output, as the fifth internal data ID<5>, the second selection data SD2 that has been latched.

The twelfth output latch 410_12 may latch the third alignment data AD3 at timing at which the third write output control signal WPOUT<3> having a logic high level is input, and may output, as the sixth internal data ID<6>, the third alignment data AD3 that has been latched.

The thirteenth output latch 410_13 may latch the second transfer data TD2 at timing at which the third write output control signal WPOUT<3> having a logic high level is input, and may output, as the seventh internal data ID<7>, the second transfer data TD2 that has been latched.

The fourteenth output latch 410_14 may latch the fourth alignment data AD4 at timing at which the third write output control signal WPOUT<3> having a logic high level is input, and may output, as the eighth internal data ID<8>, the fourth alignment data AD4 that has been latched.

Figure 20:
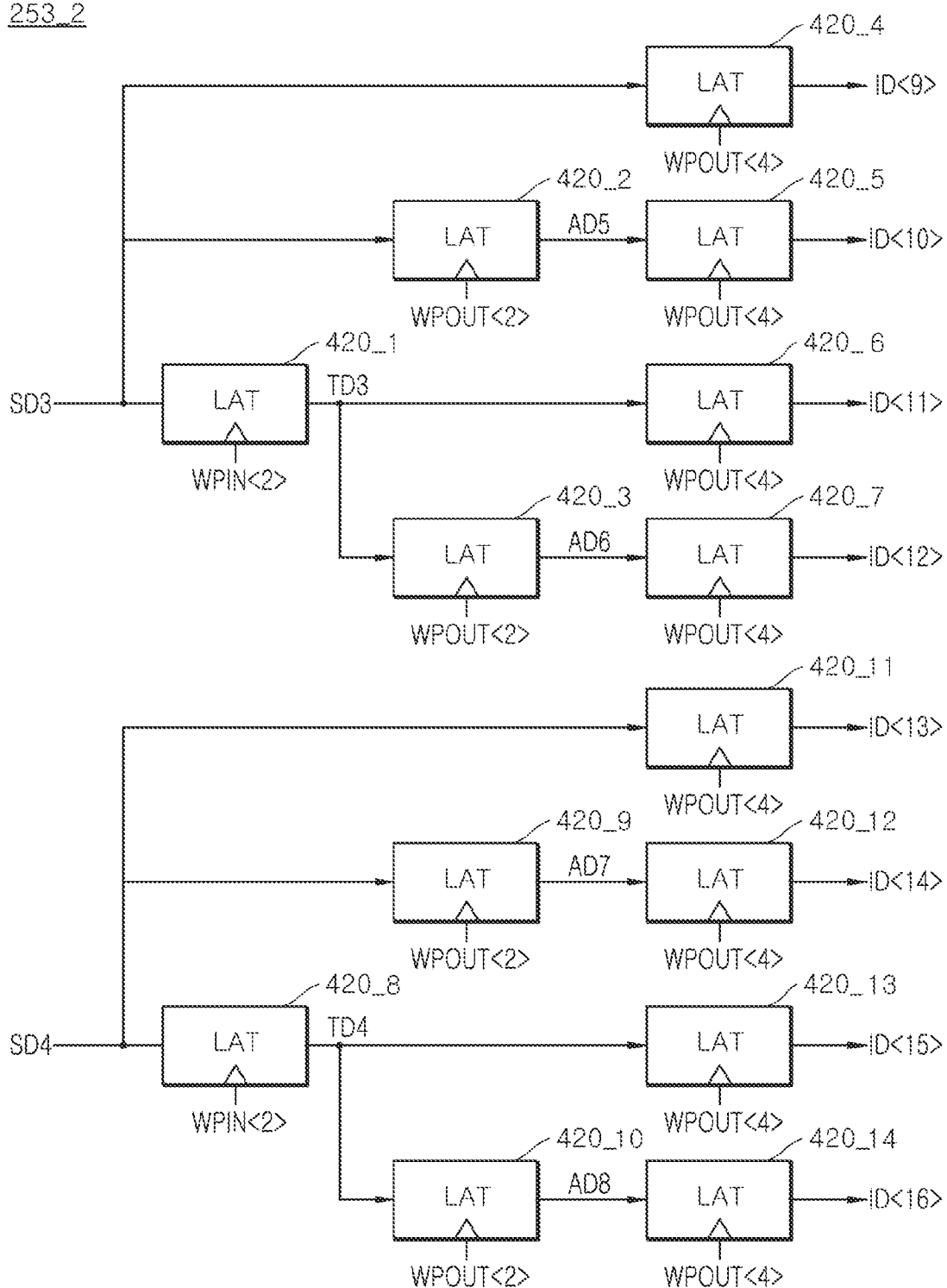
FIG. 20 is a block diagram illustrating a construction of a second alignment circuit that is included in the data alignment circuit illustrated in FIG. 18.

FIG. 20 is a block diagram illustrating a construction according to an embodiment of the second alignment circuit 253_2 that is included in the data alignment circuit 253. The second alignment circuit 253_2 may include a fifteenth output latch (LAT) 420_1, a sixteenth output latch (LAT) 420_2, a seventh output latch (LAT) 420_3, an eighteenth output latch (LAT) 420_4, a nineteenth output latch (LAT) 420_5, a twentieth output latch (LAT) 420_6, a twenty-first output latch (LAT) 420_7, a twenty-second output latch (LAT) 420_8, a twenty-third output latch (LAT) 420_9, a twenty-fourth output latch (LAT) 420_10, a twenty-fifth output latch (LAT) 420_11, a twenty-sixth output latch (LAT) 420_12, a twenty-seventh output latch (LAT) 420_13, and a twenty-eighth output latch (LAT) 420_14.

The fifteenth output latch 420_1 may latch the third selection data SD3 at timing at which the second write input control signal WPIN<2> having a logic high level is input, and may output, as third transfer data TD3, the third selection data SD3 that has been latched.

The sixteenth output latch 420_2 may latch the third selection data SD3 at timing at which the second write output control signal WPOUT<2> having a logic high level is input, and may output, as fifth alignment data AD5, the third selection data SD3 that has been latched.

The seventeenth output latch 420_3 may latch the third transfer data TD3 at timing at which the second write output control signal WPOUT<2> having a logic high level is input, and may output, as sixth alignment data AD6, the third transfer data TD3 that has been latched.

The eighteenth output latch 420_4 may latch the third selection data SD3 at timing at which the fourth write output control signal WPOUT<4> having a logic high level is input, and may output, as the ninth internal data ID<9>, the third selection data SD3 that has been latched.

The nineteenth output latch 420_5 may latch the fifth alignment data AD5 at timing at which the fourth write output control signal WPOUT<4> having a logic high level is input, and may output, as the tenth internal data ID<10>, the fifth alignment data AD5 that has been latched.

The twentieth output latch 420_6 may latch the third transfer data TD3 at timing at which the fourth write output control signal WPOUT<4> having a logic high level is input, and may output, as the eleventh internal data ID<11>, the third transfer data TD3 that has been latched.

The twenty-first output latch 420_7 may latch the sixth alignment data AD6 at timing at which the fourth write output control signal WPOUT<4> having a logic high level is input, and may output, as the twelfth internal data ID<12>, the sixth alignment data AD6 that has been latched.

The twenty-second output latch 420_8 may latch the fourth selection data SD4 at timing at which the second write input control signal WPIN<2> having a logic high level is input, and may output, as fourth transfer data TD4, the fourth selection data SD4 that has been latched.

The twenty-third output latch 420_9 may latch the fourth selection data SD4 at timing at which the second write output control signal WPOUT<2> having a logic high level is input, and may output, as seventh alignment data AD7, the fourth selection data SD4 that has been latched.

The twenty-fourth output latch 420_10 may latch the fourth transfer data TD4 at timing at which the second write output control signal WPOUT<2> having a logic high level is input, and may output, as eighth alignment data AD8, the fourth transfer data TD4 that has been latched.

The twenty-fifth output latch 420_11 may latch the fourth selection data SD4 at timing at which the fourth write output control signal WPOUT<4> having a logic high level is input, and may output, as the thirteenth internal data ID<13>, the fourth selection data SD4 that has been latched.

The twenty-sixth output latch 420_12 may latch the seventh alignment data AD7 at timing at which the fourth write output control signal WPOUT<4> having a logic high level is input, and may output, as the fourteenth internal data ID<14>, the seventh alignment data AD7 that has been latched.

The twenty-seventh output latch 420_13 may latch the fourth transfer data TD4 at timing at which the fourth write output control signal WPOUT<4> having a logic high level is input, and may output, as the fifteenth internal data ID<15>, the fourth transfer data TD4 that has been latched.

The twenty-eighth output latch 420_14 may latch the eighth alignment data AD8 at timing at which the fourth write output control signal WPOUT<4> having a logic high level is input, and may output, as the sixteenth internal data ID<16>, the eighth alignment data AD8 that has been latched.

An operation of the semiconductor system 1 according to an embodiment of the present disclosure is described with reference to FIGS. 21 to 23. In this case, an operation of generating, by the first memory device 20, the first to sixteenth internal data ID<1:16> by aligning the first to eighth data DATA<1:8> and storing the first to sixteenth internal data ID<1:16> in the first operation mode is described as follows.

The test device 10 may output the first chip selection signal CS1, the clock CLK, the command address CA, the write clock WCK, and the first to eighth data DATA<1:8>. The command address CA that includes a command and an address for performing a write operation may be output. The first to eighth data DATA<1:8> may be output so that the first to eighth data are synchronized with timing at which a rising edge of the write clock WCK is generated.

The command decoder 210 of the first memory device 20 may generate the write command WT based on the command address CA, in synchronization with the clock CLK when the first chip selection signal CS1 is enabled.

The address decoder 220 may generate the internal address IADD based on the command address CA, in synchronization with the clock CLK when the first chip selection signal CS1 is disabled.

The test device 10 may sequentially output the first chip selection signal CS1, the clock CLK, and the command address CA including a command, mode information, and operation information for performing the first and second mode register write operations.

The command decoder 210 of the first memory device 20 may generate the second mode write command MRW2 after generating the first mode write command MRW1 based on the command address CA, in synchronization with the clock CLK when the first chip selection signal CS1 is enabled.

The test signal generation circuit 240 may generate the rising test signal TMR having a logic high level and the falling test signal TMF having a logic low level, based on the first to seventh mode information MA<1:7> that are received from the command address CA when the first chip selection signal CS1 is enabled and the first mode write command MRW1 is enabled and the first to eighth operation information OP<1:8> that are received from the command address CA when the second mode write command MRW2 is enabled.

At timing T11, the frequency division circuit 231 may generate the first internal clock ICLK having a logic high level by dividing the frequency of the write clock WCK.

The first buffer 251_11 of the buffer circuit 251_1 may generate the first input data IND1 by buffering the first data DATA<1> that is input in synchronization with a rising edge of the first internal clock ICLK.

At timing T12, the frequency division circuit 231 of the control circuit 230 may generate the second internal clock QCLK having a logic high level by dividing the frequency of the write clock WCK.

The control signal generation circuit 232 may generate the first write input control signal WPIN<1> having a logic high level by buffering the second internal clock QCLK.

The second buffer 251_12 of the buffer circuit 251_1 may generate the second input data IND2 by buffering the first data DATA<1> that is input in synchronization with a rising edge of the second internal clock QCLK.

The first input latch 251_21 may latch the first input data IND1 when the first write input control signal WPIN<1> is enabled to a logic high level, and may output, as the first latch data LD1, the first input data IND1 that has been latched. The second input latch 251_22 may latch the second input data IND2 when the first write input control signal WPIN<1> is enabled to a logic high level, and may output, as the second latch data LD2, the second input data IND2 that has been latched.

The first selection transferrer 252_1 may output the first latch data LD1 as the first selection data SD1 when the test falling signal TMF is disabled to a logic low level. The second selection transferrer 252_2 may output the first latch data LD1 as the second selection data SD2 when the test rising signal TMR is enabled to a logic high level.

At timing T13, the frequency division circuit 231 may generate the third internal clock IBCLK having a logic high level by dividing the frequency of the write clock WCK.

The third buffer 251_13 of the buffer circuit 251_1 may generate the third input data IND3 by buffering the second data DATA<2> that is input in synchronization with a rising edge of the third internal clock IBCLK.

At timing T14, the frequency division circuit 231 of the control circuit 230 may generate the fourth internal clock QBCLK having a logic high level by dividing the frequency of the write clock WCK.

The control signal generation circuit 232 may generate the second write input control signal WPIN<2> having a logic high level by buffering the fourth internal clock QBCLK.

The fourth buffer 251_14 of the buffer circuit 251_1 may generate the fourth input data IND4 by buffering the second data DATA<2> that is input in synchronization with a rising edge of the fourth internal clock QBCLK.

The third input latch 251_23 may latch the third input data IND3 when the second write input control signal WPIN<2> is enabled to a logic high level, and may output, as the third latch data LD3, the third input data IND3 that has been latched. The fourth input latch 251_24 may latch the fourth input data IND4 when the second write input control signal WPIN<2> is enabled to a logic high level, and may output, as the fourth latch data LD4, the fourth input data IND4 that has been latched.

The third selection transferrer 252_3 may output the third latch data LD3 as the third selection data SD3 when the test falling signal TMF is disabled to a logic low level. The fourth selection transferrer 252_4 may output the third latch data LD3 as the fourth selection data SD4 when the test rising signal TMR is enabled to a logic high level.

Thereafter, an operation of generating the first to fourth input data IND1, IND2, IND3, and IND4, the first to fourth latch data LD1, LD2, LD3, and LD4, and the first to fourth selection data SD1, SD2, SD3, and SD4 from the third to eighth data DATA<3:8> is the same as the operation from timing T11 to timing T14, and a detailed description thereof is omitted.

At timing T15, the control signal generation circuit 232 may generate the first write output control signal WPOUT<1> having a logic high level, based on the write delay signal WTD that is generated by delaying the write command WT, the second internal clock QCLK, and the fourth internal clock QBCLK.

The first output latch 410_1 may latch the first selection data SD1 at timing at which the first write input control signal WPIN<1> having a logic high level is input, and may output, as the first transfer data TD1, the first selection data SD1 that has been latched. The second output latch 410_2 may latch the first selection data SD1 at timing at which the first write output control signal WPOUT<1> having a logic high level is input, and may output, as the first alignment data AD1, the first selection data SD1 that has been latched. The third output latch 410_3 may latch the first transfer data TD1 at timing at which the first write output control signal WPOUT<1> having a logic high level is input, and may output, as the second alignment data AD2, the first transfer data TD1 that has been latched. The eighth output latch 410_8 may latch the second selection data SD2 at timing at which the first write input control signal WPIN<1> having a logic high level is input, and may output, as the second transfer data TD2, the second selection data SD2 that has been latched. The ninth output latch 410_9 may latch the second selection data SD2 at timing at which the first write output control signal WPOUT<1> having a logic high level is input, and may output, as the third alignment data AD3, the second selection data SD2 that has been latched. The tenth output latch 410_10 may latch the second transfer data TD2 at timing at which the first write output control signal WPOUT<1> having a logic high level is input, and may output, as the fourth alignment data AD4, the second transfer data TD2 that has been latched.

At timing T16, the control signal generation circuit 232 may generate the second write output control signal WPOUT<2> having a logic high level, based on the write delay signal WTD that is generated by delaying the write command WT, the second internal clock QCLK, and the fourth internal clock QBCLK.

The fifteenth output latch 420_1 may latch the third selection data SD3 at timing at which the second write input control signal WPIN<2> having a logic high level is input, and may output, as the third transfer data TD3, the third selection data SD3 that has been latched. The sixteenth output latch 420_2 may latch the third selection data SD3 at timing at which the second write output control signal WPOUT<2> having a logic high level is input, and may output, as the fifth alignment data AD5, the third selection data SD3 that has been latched. The seventh output latch 420_3 may latch the third transfer data TD3 at timing at which the second write output control signal WPOUT<2> having a logic high level is input, and may output, as the sixth alignment data AD6, the third transfer data TD3 that has been latched. The twenty-second output latch 420_8 may latch the fourth selection data SD4 at timing at which the second write input control signal WPIN<2> having a logic high level is input, and may output, as the fourth transfer data TD4, the fourth selection data SD4 that has been latched. The twenty-third output latch 420_9 may latch the fourth selection data SD4 at timing at which the second write output control signal WPOUT<2> having a logic high level is input, and may output, as the seventh alignment data AD7, the fourth selection data SD4 that has been latched. The twenty-fourth output latch 420_10 may latch the fourth transfer data TD4 at timing at which the second write output control signal WPOUT<2> having a logic high level is input, and may output, as the eighth alignment data AD8, the fourth transfer data TD4 that has been latched.

Thereafter, an operation of generating the first to fourth transfer data TD1, TD2, TD3, and TD4 from the third to eighth data DATA<3:8> is the same as the operation from timing T15 to timing T16, and a detailed description thereof is omitted.

At timing T17, the control signal generation circuit 232 may generate the third write output control signal WPOUT<3> having a logic high level, based on the write delay signal WTD that is generated by delaying the write command WT, the second internal clock QCLK, and the fourth internal clock QBCLK.

The fourth output latch 410_4 may latch the first selection data SD1 at timing at which the third write output control signal WPOUT<3> having a logic high level is input, and may output, as the first internal data ID<1>, the first selection data SD1 that has been latched. The fifth output latch 410_5 may latch the first alignment data AD1 at timing at which the third write output control signal WPOUT<3> having a logic high level is input, and may output, as the second internal data ID<2>, the first alignment data AD1 that has been latched. The sixth output latch 410_6 may latch the first transfer data TD1 at timing at which the third write output control signal WPOUT<3> having a logic high level is input, and may output, as the third internal data ID<3>, the first transfer data TD1 that has been latched. The seventh output latch 410_7 may latch the second alignment data AD2 at timing at which the third write output control signal WPOUT<3> having a logic high level is input, and may output, as the fourth internal data ID<4>, the second alignment data AD2 that has been latched. The eleventh output latch 410_11 may latch the second selection data SD2 at timing at which the third write output control signal WPOUT<3> having a logic high level is input, and may output, as the fifth internal data ID<5>, the second selection data SD2 that has been latched. The twelfth output latch 410_12 may latch the third alignment data AD3 at timing at which the third write output control signal WPOUT<3> having a logic high level is input, and may output, as the sixth internal data ID<6>, the third alignment data AD3 that has been latched. The thirteenth output latch 410_13 may latch the second transfer data TD2 at timing at which the third write output control signal WPOUT<3> having a logic high level is input, and may output, as the seventh internal data ID<7>, the second transfer data TD2 that has been latched. The fourteenth output latch 410_14 may latch the fourth alignment data AD4 at timing at which the third write output control signal WPOUT<3> having a logic high level is input, and may output, as the eighth internal data ID<8>, the fourth alignment data AD4 that has been latched.

At timing T18, the control signal generation circuit 232 may generate the fourth write output control signal WPOUT<4> having a logic high level, based on the write delay signal WTD that is generated by delaying the write command WT, the second internal clock QCLK, and the fourth internal clock QBCLK.

The eighteenth output latch 420_4 may latch the third selection data SD3 at timing at which the fourth write output control signal WPOUT<4> having a logic high level is input, and may output, as the ninth internal data ID<9>, the third selection data SD3 that has been latched. The nineteenth output latch 420_5 may latch the fifth alignment data AD5 at timing at which the fourth write output control signal WPOUT<4> having a logic high level is input, and may output, as the tenth internal data ID<10>, the fifth alignment data AD5 that has been latched. The twentieth output latch 420_6 may latch the third transfer data TD3 at timing at which the fourth write output control signal WPOUT<4> having a logic high level is input, and may output, as the eleventh internal data ID<11>, the third transfer data TD3 that has been latched. The twenty-first output latch 420_7 may latch the sixth alignment data AD6 at timing at which the fourth write output control signal WPOUT<4> having a logic high level is input, and may output, as the twelfth internal data ID<12>, the sixth alignment data AD6 that has been latched. The twenty-fifth output latch 420_11 may latch the fourth selection data SD4 at timing at which the fourth write output control signal WPOUT<4> having a logic high level is input, and may output, as the thirteenth internal data ID<13>, the fourth selection data SD4 that has been latched. The twenty-sixth output latch 420_12 may latch the seventh alignment data AD7 at timing at which the fourth write output control signal WPOUT<4> having a logic high level is input, and may output, as the fourteenth internal data ID<14>, the seventh alignment data AD7 that has been latched. The twenty-seventh output latch 420_13 may latch the fourth transfer data TD4 at timing at which the fourth write output control signal WPOUT<4> having a logic high level is input, and may output, as the fifteenth internal data ID<15>, the fourth transfer data TD4 that has been latched. The twenty-eighth output latch 420_14 may latch the eighth alignment data AD8 at timing at which the fourth write output control signal WPOUT<4> having a logic high level is input, and may output, as the sixteenth internal data ID<16>, the eighth alignment data AD8 that has been latched.

The core circuit 260 may store the first to sixteenth internal data ID<1:16> in a memory cell (not illustrated) that is selected by the internal address IADD when the write command WT is enabled.

Figure 21:
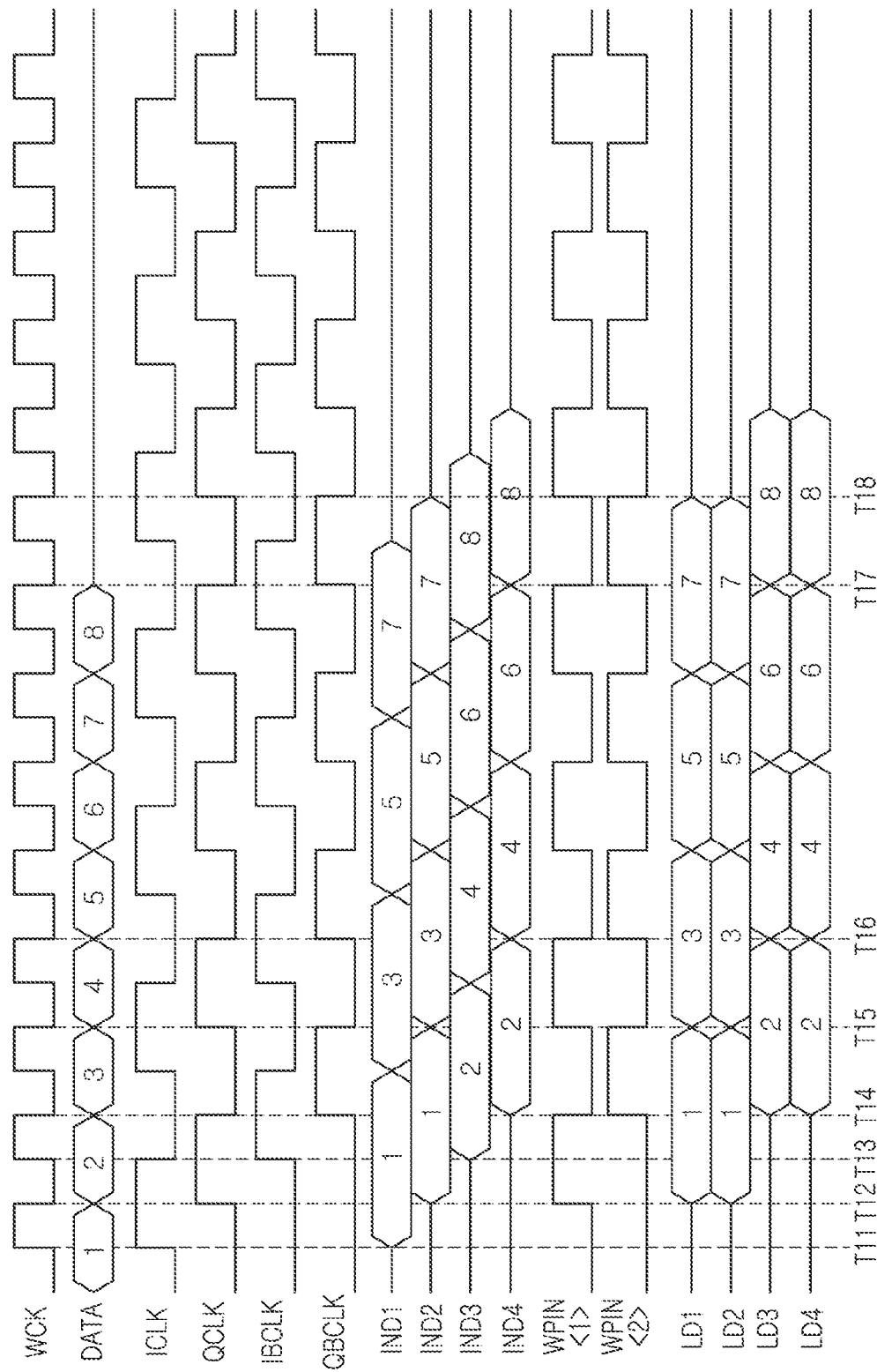
FIGS. 21 to 23 are timing diagrams for describing a data alignment operation of the semiconductor system according to an embodiment of the present disclosure.
Figure 22:
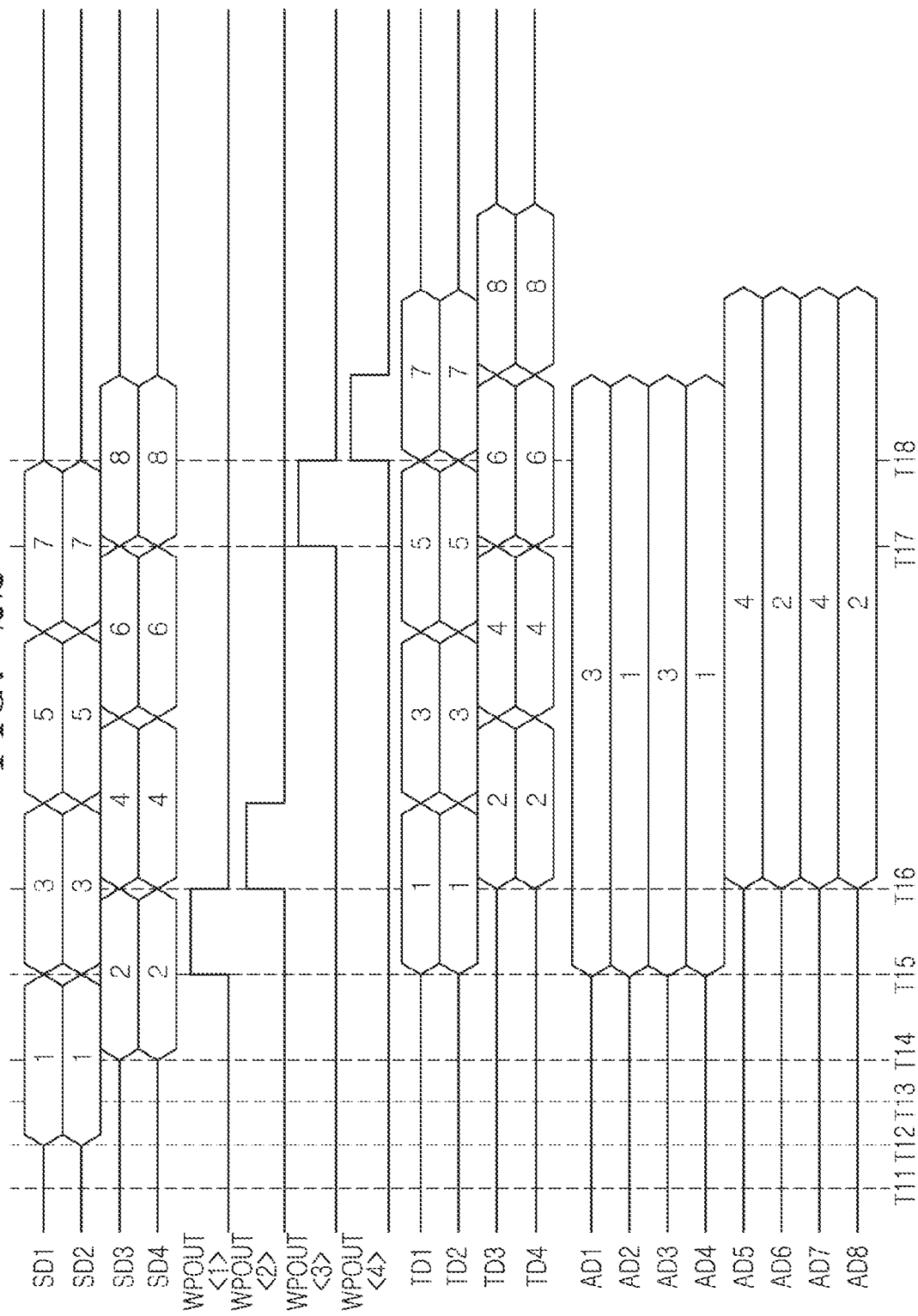
Figure 23:
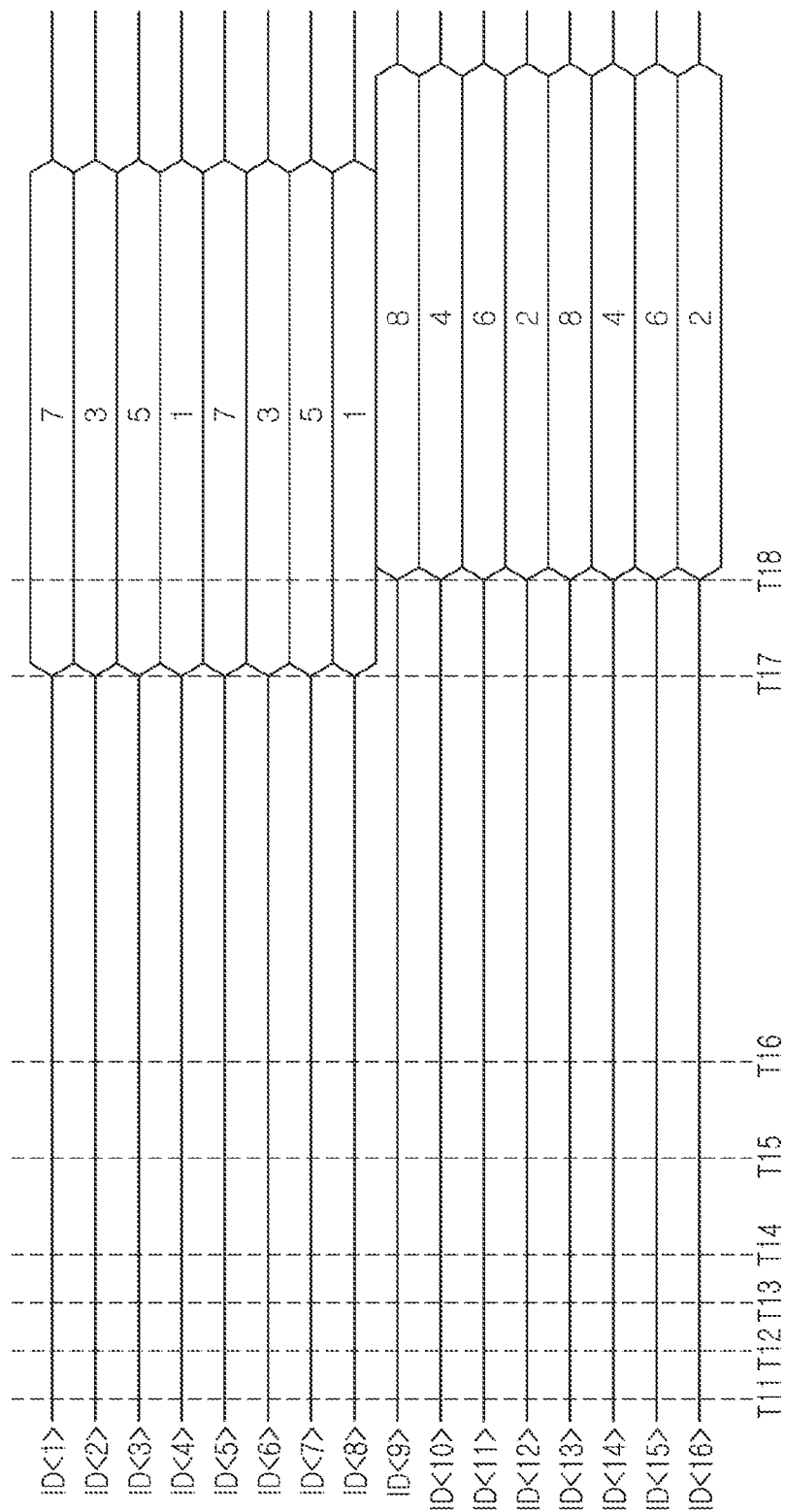

In the drawings illustrated in FIGS. 21 to 23, it means that the natural numbers 1 to 8 illustrated in the pulses of the first to fourth input data IND1, IND2, IND3, and IND4, the first to fourth latch data LD1, LD2, LD3, and LD4, the first to fourth selection data SD1, SD2, SD3, and SD4, the first to fourth transfer data TD1, TD2, TD3, and TD4, the first to eighth alignment data AD1, AD2, AD3, AD4, AD5, AD6, AD7, and AD8, and the first to sixteenth internal data ID<1:16> are generated from the multiple bits of the first to eighth data DATA<1:8>.

In the present disclosure, the second operation mode may be an operation of the first to eighth data DATA<1:8> being output so that the first to eighth data are synchronized with timing at which a falling edge of the write clock WCK is generated, and is similar to the first operation mode. Accordingly, a detailed description of the second operation mode is omitted.

The semiconductor system 1, in an embodiment, can use, as a single data rate (SDR) synchronous memory device, double data rate (DDR) synchronous memory devices in which the data DATA is input and output at a rising edge and falling edge of the write clock WCK in a way that the test device 10 transmits the data DATA having the pulse width of one cycle of the write clock WCK to the first and second memory devices 20 and 30. The semiconductor system 1, in an embodiment, can perform a stable write operation on memory devices having different internal delay times depending on a process voltage temperature (PVT) change by using DDR synchronous memory devices as an SDR synchronous memory device.

Figure 24:
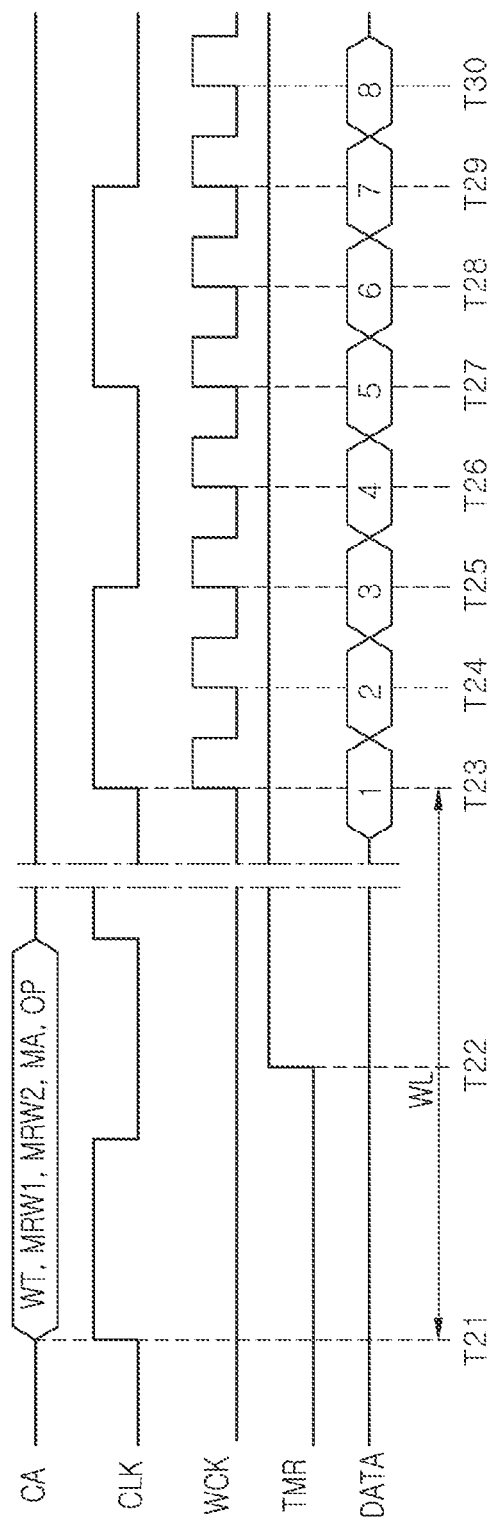
FIG. 24 is a timing diagram for describing a first operation mode of the semiconductor system according to an embodiment of the present disclosure.

An operation of performing, by the first memory device 20 that is included in the semiconductor system 1 according to an embodiment of the present disclosure, the first operation mode is described with reference to FIG. 24. In this case, an operation of the first to eighth data DATA<1:8> being output as the pulse width of one cycle of the write clock WCK and the first memory device 20 being used as an SDR synchronous memory device is described as follows.

At timing T21, the test device 10 may sequentially output the command address CA, including the write command WT, the first mode register write command MRW1, the second mode register write command MRW2, the mode information MA, and the operation information OP, and may output the clock CLK.

At timing T22, the test signal generation circuit 240 of the first memory device 20 may generate the rising test signal TMR having a logic high level, based on the first to seventh mode information MA<1:7> that are input from the command address CA when the first mode write command MRW1 is enabled and the first to eighth operation information OP<1:8> that are input from the command address CA when the second mode write command MRW2 is enabled.

At timing T23, the test device 10 may output the write clock WCK and the first to eighth data DATA<1:8> in series after a write latency interval WL. The pulse width of bits of the first to eighth data DATA<1:8> may be output as one cycle of the write clock WCK.

The first memory device 20 may latch the first data DATA<1> that is input at a rising edge of the write clock WCK.

At timing T24, the first memory device 20 may latch the second data DATA<2> that is input at a rising edge of the write clock WCK.

At timing T25, the first memory device 20 may latch the third data DATA<3> that is input at a rising edge of the write clock WCK.

At timing T26, the first memory device 20 may latch the fourth data DATA<4> that is input at a rising edge of the write clock WCK.

At timing T27, the first memory device 20 may latch the fifth data DATA<5> that is input at a rising edge of the write clock WCK.

At timing T28, the first memory device 20 may latch the sixth data DATA<6> that is input at a rising edge of the write clock WCK.

At timing T29, the first memory device 20 may latch the seventh data DATA<7> that is input at a rising edge of the write clock WCK.

At timing T30, the first memory device 20 may latch the eighth data DATA<8> that is input at a rising edge of the write clock WCK.

The first memory device 20 may align and store the first to eighth data DATA<1:8> that have been latched at the rising edges of the write clock WCK, in the first operation mode.

The semiconductor system 1 can use, as an SDR synchronous memory device, DDR synchronous memory devices in which the data DATA is input and output at a rising edge and falling edge of the write clock WCK in a way that the test device 10 transmits the data DATA having the pulse width of one cycle of the write clock WCK to the first memory device 20. The semiconductor system 1 can perform a stable write operation on memory devices having different internal delay times depending on a PVT change by using DDR synchronous memory devices as an SDR synchronous memory device.

Figure 25:
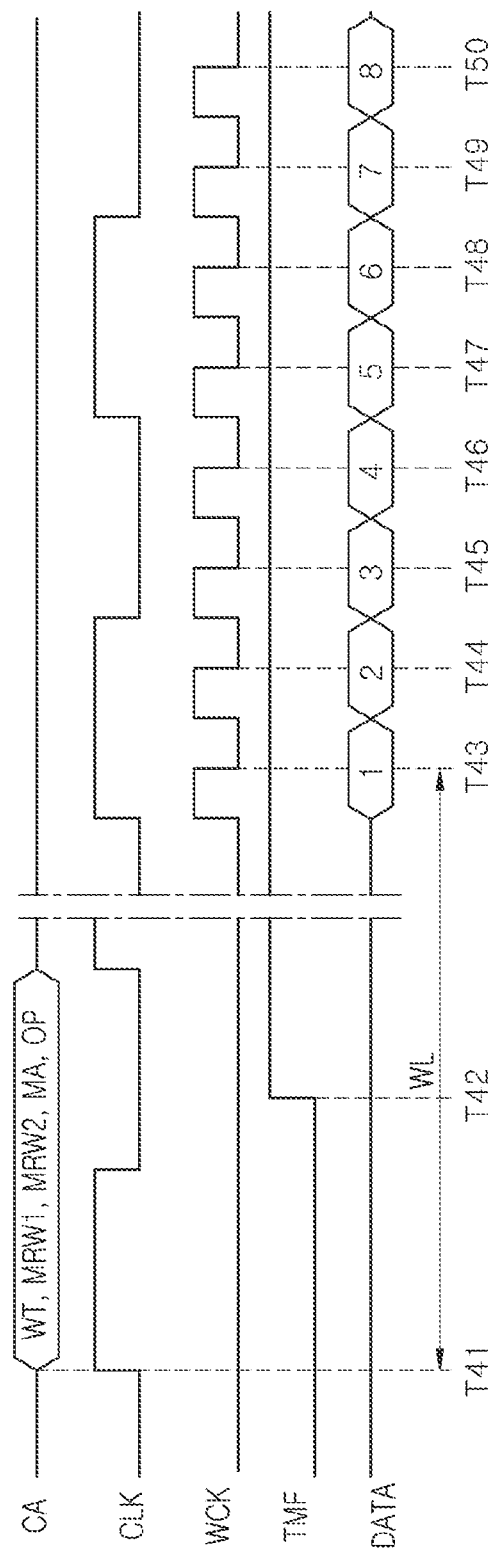
FIG. 25 is a timing diagram for describing a second operation mode of the semiconductor system according to an embodiment of the present disclosure.

An operation of performing, by the first memory device 20 that is included in the semiconductor system 1 according to an embodiment of the present disclosure, the second operation mode is described with reference to FIG. 25. In this case, an operation of the first to eighth data DATA<1:8> being output as the pulse width of one cycle of the write clock WCK and the first memory device 20 being used as an SDR synchronous memory device is described as follows.

At timing T41, the test device 10 may sequentially output the command address CA, including the write command WT, the first mode register write command MRW1, the second mode register write command MRW2, the mode information MA, and the operation information OP, and may output the clock CLK.

At timing T42, the test signal generation circuit 240 of the first memory device 20 may generate the falling test signal TMF having a logic high level, based on the first to seventh mode information MA<1:7> that are input from the command address CA when the first mode write command MRW1 is enabled and the first to eighth operation information OP<1:8> that are input from the command address CA when the second mode write command MRW2 is enabled.

At timing T43, the test device 10 may output the write clock WCK and the first to eighth data DATA<1:8> in series after a write latency interval WL. The pulse width of bits of the first to eighth data DATA<1:8> may be output as one cycle of the write clock WCK.

The first memory device 20 may latch the first data DATA<1> that is input at a falling edge of the write clock WCK.

At timing T44, the first memory device 20 may latch the second data DATA<2> that is input at a falling edge of the write clock WCK.

At timing T45, the first memory device 20 may latch the third data DATA<3> that is input at a falling edge of the write clock WCK.

At timing T46, the first memory device 20 may latch the fourth data DATA<4> that is input at a falling edge of the write clock WCK.

At timing T47, the first memory device 20 may latch the fifth data DATA<5> that is input at a falling edge of the write clock WCK.

At timing T48, the first memory device 20 may latch the sixth data DATA<6> that is input at a falling edge of the write clock WCK.

At timing T49, the first memory device 20 may latch the seventh data DATA<7> that is input at a falling edge of the write clock WCK.

At timing T50, the first memory device 20 may latch the eighth data DATA<8> that is input at a falling edge of the write clock WCK.

The first memory device 20 may align and store the first to eighth data DATA<1:8> that have been latched at the falling edges of the write clock WCK, in the first operation mode.

The semiconductor system 1, in an embodiment, can use, as an SDR synchronous memory device, DDR synchronous memory devices in which the data DATA is input and output at a rising edge and falling edge of the write clock WCK in a way that the test device 10 transmits the data DATA having the pulse width of one cycle of the write clock WCK to the first memory device 20. The semiconductor system 1, in an embodiment, can perform a stable write operation on memory devices having different internal delay times depending on a PVT change by using DDR synchronous memory devices as an SDR synchronous memory device.

What is claimed is:
1. A semiconductor system comprising:
a first memory device and a second memory device configured to share a first transmission line from which a write clock is received and a second transmission line from which data is received,
wherein the first memory device receives the data in synchronization with first, second, third, and fourth internal clocks that are generated by dividing a frequency of the write clock, and selectively aligns and stores at least some of the data that is received in synchronization with the first to fourth internal clocks based on timing at which the data is synchronized with the write clock, and the second memory device receives the data in synchronization with fifth, sixth, seventh, and eighth internal clocks that are generated by dividing the frequency of the write clock, and selectively aligns and stores at least some of the data that is received in synchronization with the fifth to eighth internal clocks based on timing at which the data is synchronized with the write clock.

2. The semiconductor system of claim 1, wherein the data has a pulse width of one cycle of the write clock and is input to the first memory device and the second memory device through the second transmission line.

3. The semiconductor system of claim 1, wherein:
the data comprises multiple bits that are input in series, and
the multiple bits that are included in the data are input to the first memory device and the second memory device so that the multiple bits are synchronized with timing at which any one of a rising edge of the write clock or a falling edge of the write clock is generated.

4. The semiconductor system of claim 1, wherein the first memory device comprises:
a first control circuit configured to generate the first to fourth internal clocks by dividing the frequency of the write clock and configured to generate first and second write input control signals and first, second, third, and fourth write output control signals based on the second internal clock and the fourth internal clock;
a first data processing circuit configured to receive the data comprising multiple bits in synchronization with the first to fourth internal clocks and configured to generate first internal data that comprise multiple bits and that are generated in parallel by aligning the multiple bits that are included in the data based on the first and second write input control signals and the first to fourth write output control signals; and
a first core circuit configured to store the first internal data.

5. The semiconductor system of claim 4, wherein the first control circuit comprises:
a first frequency division circuit configured to generate the first to fourth internal clocks by dividing the frequency of the write clock; and
a first control signal generation circuit configured to generate the first and second write input control signals and the first to fourth write output control signals, based on a write delay signal that is generated after a start of a write operation, the second internal clock, and the fourth internal clock.

6. The semiconductor system of claim 5, wherein the first control signal generation circuit comprises:
a first input control signal generation circuit configured to generate the first write input control signal based on the second internal clock and configured to generate the second write input control signal based on the fourth internal clock; and
a first output control signal generation circuit configured to generate the first to fourth write output control signals that are sequentially enabled in synchronization with the second internal clock and the fourth internal clock when the write delay signal is enabled.

7. The semiconductor system of claim 1, wherein the second memory device comprises
a second control circuit configured to generate the fifth to eighth internal clocks by dividing the frequency of the write clock and configured to generate third and fourth write input control signals and fifth, sixth, seventh, and eighth write output control signals based on the sixth internal clock and the eighth internal clock;
a second data processing circuit configured to receive the data comprising multiple bits in synchronization with the fifth to eighth internal clocks and configured to generate second internal data that comprise multiple bits and that are generated in parallel by aligning the multiple bits that are included in the data based on the third and fourth write input control signals and the fifth to eighth write output control signals; and
a second core circuit configured to store the second internal data.

8. The semiconductor system of claim 7, wherein the second control circuit comprises:
a second frequency division circuit configured to generate the fifth to eighth internal clocks by dividing the frequency of the write clock; and
a second control signal generation circuit configured to generate the third and fourth write input control signals and the fifth to eighth write output control signals, based on a write delay signal that is generated after a start of a write operation, the sixth internal clock, and the eighth internal clock.

9. The semiconductor system of claim 8, wherein the second control signal generation circuit comprises:
a second input control signal generation circuit configured to generate the third write input control signal based on the sixth internal clock and configured to generate the fourth write input control signal based on the eighth internal clock; and
a second output control signal generation circuit configured to generate the fifth to eighth write output control signals that are sequentially enabled in synchronization with the sixth internal clock and the eighth internal clock when the write delay signal is enabled.

10. A semiconductor system comprising:
a test device configured to output a command address, a clock, and a write clock and configured to output data comprising multiple bits; and
a memory device configured to enter a write operation based on the command address that is input in synchronization with the clock, configured to generate first, second, third, and fourth latch data by receiving the data in synchronization with first, second, third, and fourth internal clocks that are generated by dividing a frequency of the write clock in a write operation, configured to generate internal data comprising multiple bits by aligning at least some of the first to fourth latch data based on timing at which the data is synchronized with the write clock, and configured to store the internal data.

11. The semiconductor system of claim 10, wherein the multiple bits that are included in the data are input as a pulse width of one cycle of the write clock.

12. The semiconductor system of claim 10, wherein the multiple bits that are included in the data are input to the memory device so that the multiple bits are synchronized with timing at which any one of a rising edge of the write clock or a falling edge of the write clock is generated.

13. The semiconductor system of claim 10, wherein:
the multiple bits that are included in the data are input to the memory device in series, and
the multiple bits that are included in the internal data are generated in parallel and stored in the memory device.

14. The semiconductor system of claim 10, wherein when the multiple bits that are included in the data are input to the memory device at timing at which a rising edge of the write clock is generated, the memory device generates the internal data by aligning the first and third latch data.

15. The semiconductor system of claim 10, wherein when the multiple bits that are included in the data are input to the memory device at timing at which a falling edge of the write clock is generated, the memory device generates the internal data by aligning the second and fourth latch data.

16. The semiconductor system of claim 10, wherein the memory device comprises:
   a command decoder configured to generate a write command, a first mode write command, and a second mode write command by decoding the command address in synchronization with the clock;
   a control circuit configured to generate the first to fourth internal clocks by dividing the frequency of the write clock and configured to generate first and second write input control signals and first, second, third, and fourth write output control signals based on the second internal clock and the fourth internal clock;
   a test signal generation circuit configured to generate a rising test signal and a falling test signal, based on mode information that is input from the command address when the first mode write command is input and operation information that is input from the command address when the second mode write command is input;
   a data processing circuit configured to receive the data comprising multiple bits in synchronization with the first to fourth internal clocks and configured to generate internal data that comprise multiple bits and that are generated in parallel by aligning the multiple bits that are included in the data based on the rising test signal, the falling test signal, the first and second write input control signals, and the first to fourth write output control signals; and
   a core circuit configured to store the internal data.

17. The semiconductor system of claim 16, wherein the control circuit comprises:
   a frequency division circuit configured to generate the first to fourth internal clocks by dividing the frequency of the write clock; and
   a control signal generation circuit configured to generate the first and second write input control signals and the first to fourth write output control signals, based on a write delay signal that is generated after a start of a write operation, the second internal clock, and the fourth internal clock.

18. The semiconductor system of claim 17, wherein control signal generation circuit comprises:
   an input control signal generation circuit configured to generate the first write input control signal based on the second internal clock and configured to generate the second write input control signal based on the fourth internal clock; and
   an output control signal generation circuit configured to generate the first to fourth write output control signals that are sequentially enabled in synchronization with the second internal clock and the fourth internal clock when the write delay signal is enabled.

19. The semiconductor system of claim 16, wherein the test signal generation circuit comprises:
   a command address input circuit configured to generate the mode information and the operation information by receiving the command address;
   a test enable signal generation circuit configured to generate a test enable signal that is enabled when the mode information has a logic level combination for performing a test mode when the first mode write command is input;
   an operation signal generation circuit configured to generate a first operation signal that is enabled when the operation information has a logic level combination for performing a first operation mode when the second mode write command is input and configured to generate a second operation signal that is enabled when the operation information has a logic level combination for performing a second operation mode when the second mode write command is input; and
   a selection transfer circuit configured to output the test enable signal as the rising test signal when the first operation signal is enabled and configured to output the test enable signal as the falling test signal when the second operation signal is enabled.

20. The semiconductor system of claim 16, wherein the data processing circuit generates the internal data by aligning the multiple bits that are included in the data that is input in synchronization with the first internal clock and the third internal clock when the rising test signal is input, based on the first and second write input control signals and the first to fourth write output control signals.

21. The semiconductor system of claim 16, wherein the data processing circuit generates the internal data by aligning the multiple bits that are included in the data that is input in synchronization with the second internal clock and the fourth internal clock when the falling test signal is input, based on the first and second write input control signals and the first to fourth write output control signals.

22. The semiconductor system of claim 16, wherein the data processing circuit comprises:
   a data latch circuit configured to receive the data in synchronization with the first to fourth internal clocks and configured to generate the first to fourth latch data from the data that has been input in synchronization with the first and second write input control signals;
   a data selection circuit configured to generate first and second selection data from the first latch data and configured to generate third and fourth selection data from the third latch data, when the rising test signal is input, and configured to generate the first and second selection data from the second latch data and configured to generate the third and fourth selection data from the fourth latch data, when the falling test signal is input; and
   a data alignment circuit configured to generate the internal data by aligning the first to fourth selection data based on the first and second write input control signals and the first to fourth write output control signals.

23. The semiconductor system of claim 22, wherein the data latch circuit comprises:
   A buffer circuit configured to generate first, second, third, and fourth input data by receiving the multiple bits that are included in the data that is input in series in synchronization with the first to fourth internal clocks; and
   a latch circuit configured to latch the first and second input data in synchronization with the first write input control signal, configured to output the first and second input data that have been latched as the first and second latch data, configured to latch the third and fourth input data in synchronization with the second write input control signal, and configured to output the third and fourth input data that have been latched as the third and fourth latch data.

24. The semiconductor system of claim 22, wherein the data selection circuit comprises:
 a first selection transferrer configured to output the first latch data as the first selection data when the falling test signal is disabled and configured to output the second latch data as the first selection data when the falling test signal is enabled;
 a second selection transferrer configured to output the second latch data as the second selection data when the rising test signal is disabled and configured to output the first latch data as the second selection data when the rising test signal is enabled;
 a third selection transferrer configured to output the third latch data as the third selection data when the falling test signal is disabled and configured to output the fourth latch data as the third selection data when the falling test signal is enabled; and
 a fourth selection transferrer configured to output the fourth latch data as the fourth selection data when the rising test signal is disabled and configured to output the third latch data as the fourth selection data when the rising test signal is enabled.

25. The semiconductor system of claim 22, wherein the data alignment circuit comprises:
 a first alignment circuit configured to generate the multiple bits that are included in the internal data by aligning the first and second selection data based on the first write input control signal and the first and second write output control signals; and
 a second alignment circuit configured to generate the multiple bits that are included in the internal data by aligning the third and fourth selection data based on the second write input control signal and the third and fourth write output control signals.

* * * * *